United States Patent
Herrmann

(10) Patent No.: US 11,935,480 B2
(45) Date of Patent: Mar. 19, 2024

(54) APPARATUSES, SYSTEMS, AND METHODS FOR DIMMING DISPLAYS

(71) Applicant: KOPIN CORPORATION, Westborough, MA (US)

(72) Inventor: Frederick Herrmann, Sharon, MA (US)

(73) Assignee: KOPIN CORPORATION, Westborough, MA (US)

( * ) Notice: Subject to any disclaimer, the term of this patent is extended or adjusted under 35 U.S.C. 154(b) by 0 days.

(21) Appl. No.: 17/334,702

(22) Filed: May 29, 2021

(65) Prior Publication Data

US 2021/0407420 A1  Dec. 30, 2021

Related U.S. Application Data

(60) Provisional application No. 63/033,139, filed on Jun. 1, 2020.

(51) Int. Cl.
| | |
|---|---|
| G09G 3/3208 | (2016.01) |
| G09G 3/3258 | (2016.01) |
| G09G 5/10 | (2006.01) |

(52) U.S. Cl.
CPC ......... *G09G 3/3258* (2013.01); *G09G 3/3208* (2013.01); *G09G 5/10* (2013.01); *G09G 2320/064* (2013.01); *G09G 2320/0686* (2013.01)

(58) Field of Classification Search
None
See application file for complete search history.

(56) References Cited

U.S. PATENT DOCUMENTS

| | | | |
|---|---|---|---|
| 2006/0164345 A1* | 7/2006 | Sarma | G09G 3/30 345/76 |
| 2008/0297452 A1* | 12/2008 | Roush | G09G 3/3233 345/82 |
| 2013/0141479 A1* | 6/2013 | Choi | H05B 47/16 345/691 |
| 2017/0125506 A1* | 5/2017 | Kim | G09G 3/3225 |
| 2017/0194604 A1* | 7/2017 | Chun | H10K 59/1216 |
| 2020/0348750 A1* | 11/2020 | Selan | G09G 3/3426 |
| 2020/0394925 A1* | 12/2020 | Poulose | G01C 23/00 |
| 2021/0035495 A1* | 2/2021 | Zhang | G09G 3/3208 |
| 2021/0097920 A1* | 4/2021 | Yu | G09G 3/2007 |
| 2022/0115454 A1* | 4/2022 | Ko | G09G 3/3225 |

* cited by examiner

*Primary Examiner* — Amr A Awad
*Assistant Examiner* — Donna V Bocar
(74) *Attorney, Agent, or Firm* — PELOQUIN, PLLC; Mark S Peloquin, Esq.

(57) ABSTRACT

Systems and methods are used to dim an emissive display such as an organic light emitting diode (OLED) display. A dimming level setpoint signal is received. At least one dimming process is selected from four dimming processes based on a magnitude of the dimming level setpoint signal. A first dimming process selects a subrange of pixel illumination levels from a range of pixel illumination levels. A second dimming process adjusts a VCOM voltage for the pixel array. A third dimming process selects between rolling shutter and global shutter. A fourth dimming process selectively utilizes one or more subpixels from an emissive display pixel based on the magnitude of the dimming level setpoint signal. The selected dimming process or processes are applied to the emissive display, there by dimming the display. The display can be an OLED display.

12 Claims, 20 Drawing Sheets

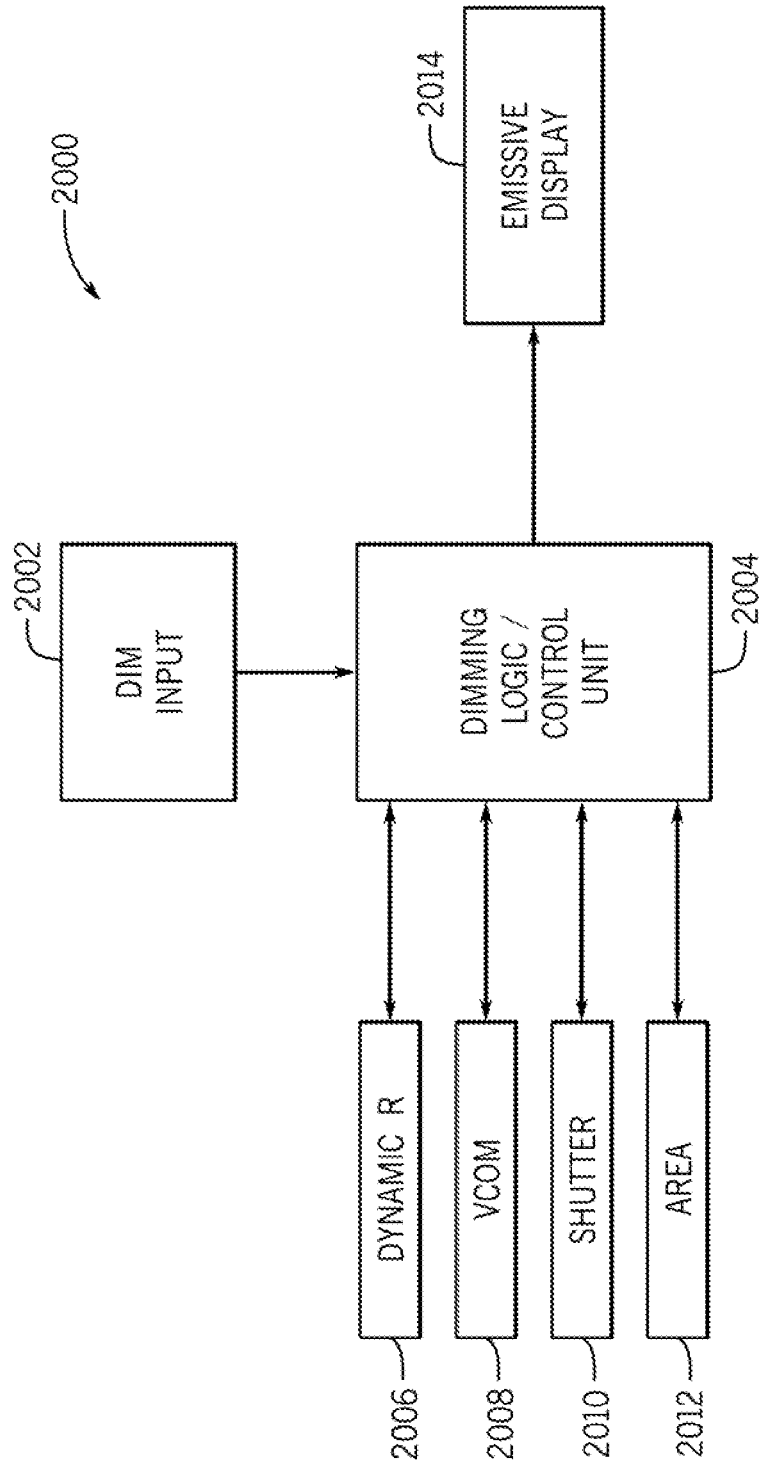

APPARATUSES, SYSTEMS, AND METHODS FOR DIMMING DISPLAYS

RELATED APPLICATIONS

This patent application claims priority from United States Provisional Patent Application titled: "APPARATUSES AND METHODS FOR DIMMING DISPLAYS," filed on Jun. 1, 2020, Ser. No. 63/033,139.

U.S. Provisional Patent Application Ser. No. 63/033,139 is hereby incorporated by reference.

BACKGROUND OF THE INVENTION

1. Field of the Invention

The invention relates generally to displays and more specifically to dimming Organic Light Emitting Diode (OLED) displays.

2. Art Background

OLED display technology is advancing at a rapid pace. In particular, development of high efficiency OLED materials as well as high throughput OLED deposition equipment has led to large scale commercialization of OLED displays. An OLED device has organic semiconductor layers that are situated between two electrodes, an anode and a cathode. The electrodes are typically made from inorganic materials. Holes and electrons are injected to the organic layers from the anode and cathode, respectively. When the electrons and holes recombine in the active organic layer, photons are emitted.

A subset of OLED displays is micro OLED displays which are generally smaller than 1 inch in diagonal size. Micro OLED displays typically have backplane integrated circuits fabricated on a single crystal Silicon (Si) substrate. Because of the high performance of Si transistors, a pixel size used to make a high-resolution display in a small size can be very small, typically equal to or less than 15 micrometer (μm). The backplane circuitry includes a pixel array, row/column drivers, video input, video processing, and programmable control.

Micro OLED displays are considered as a leading display candidate for next generation wearable products such as virtual reality (VR), augmented reality (AR), and mixed reality (MR) applications because of their small size and high resolution, low power consumption, and high video frame rate.

Some microdisplay applications require operation over a wide range of brightness depending on a given use case. For example, an augmented reality (AR) display must be bright enough for acceptable visibility in outdoor sunlight, yet also must operate at lower brightness for comfortable viewing in dark indoor environments.

Existing transmissive and reflective display technologies (e.g., liquid crystals or digital micromirrors) generally decouple the light source (back-light or front-light) from the spatial light modulator (the display panel itself). It is therefore straightforward to adjust the brightness by controlling the light source, while the full dynamic range of the display is available to control individual pixels. However, display technologies such as OLED operate by modulating emission of light at each pixel. Different dimming methods are needed to maintain dynamic range. This can present a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 20 illustrates, a flow diagram for dimming an emissive display utilizing multiple processes, according to embodiments of the invention.

DETAILED DESCRIPTION

Figure 1:
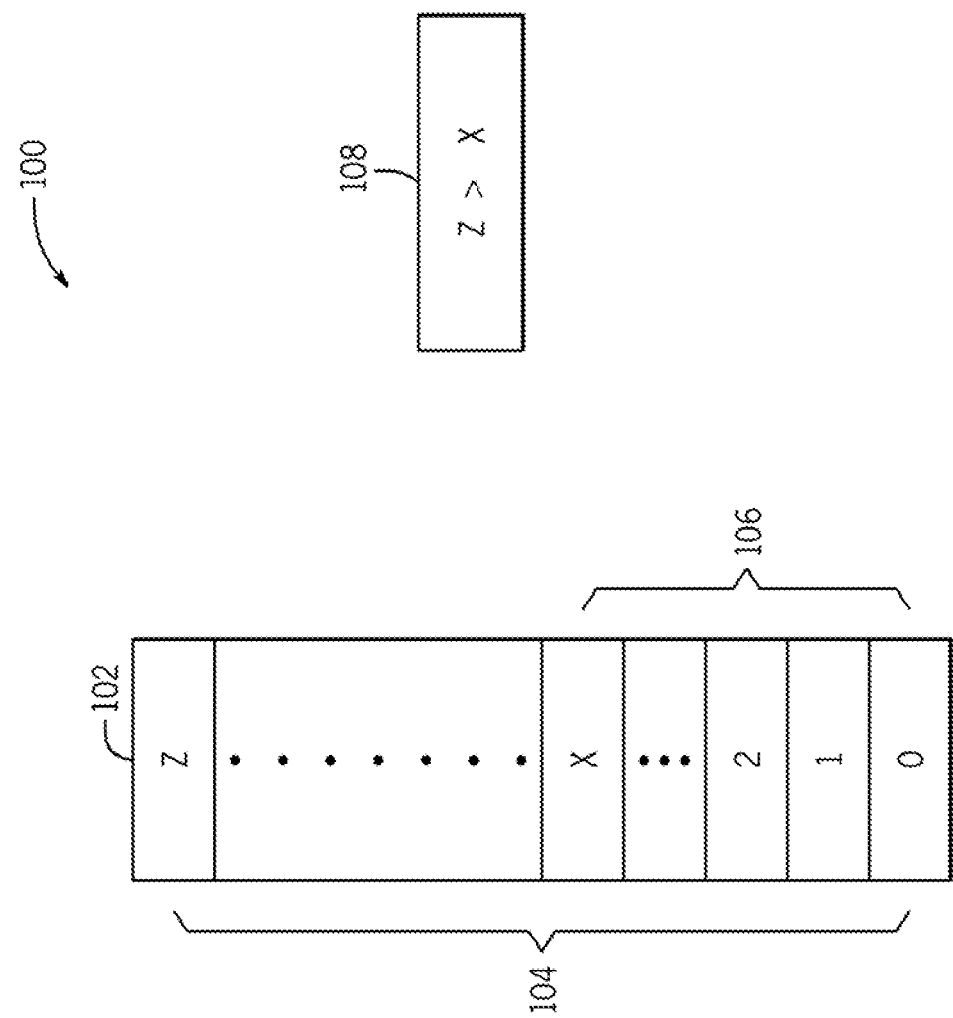
FIG. 1 illustrates multiple ranges of illumination information configured for dimming an emissive display having a general number of brightness levels, according to embodiments of the invention.

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense.

In various embodiments, apparatuses, methods, and systems are described for dimming emissive displays such as OLED displays. As used in this description of embodiments, display and micro display are to be afforded a broad meaning and can be used interchangeably. Note that embodiments of the invention are applicable to displays of various sizes including micro displays of 1.5 inch or less as measured across a diagonal of the display to large flat panel displays measuring multiple feet across a diagonal of the display. Thus, embodiments of the invention are applicable to displays of any size. Also, as used in this description of embodiments, it will be understood that a pixel of an emissive display such as an OLED display can be made from multiple subpixels, where each subpixel is used to contribute a separate color of light to the pixel. In addition, for the purpose of dimming a pixel can be divided into one or more subpixels, where each subpixel used for dimming is made with subpixels used for color. Thus, a pixel can be characterized by two levels of subpixels, a first level used for dimming and then a second level used for color. Note that the terms; "pixel," "display pixel," "display element," or "OLED device" are used synonymously and all of these terms, i.e., "pixel," "display pixel," "display element," or "OLED device" are to be distinguished from "subpixel." In addition, one or more OLED pixels will be described in the figures that follow for clarity in the illustrations, however it will be understood that such descriptions extend to an entire display having many display pixels configured in a row and many rows configured to provide displays having a general number of m rows and n columns of OLED display elements on which images are provided to a user.

As used in this description of embodiments, the term "dimming ratio" is a magnitude of a display's white level, in the brightest configuration, divided by a magnitude of the display's white level in the least bright but still useable configuration. As used in this description of embodiments, the term "dynamic range" refers to the magnitude ratio of the white:black ratio of a display in a given configuration. That is, the magnitude ratio of the brightest and darkest pixel levels that can be displayed at the same time. Either ratio may be conveniently expressed in orders of magnitude (powers of 10) or bits (powers of 2). Three orders of magnitude (1000) correspond roughly to 10 bits (1024).

In various embodiments, dimming ratios of 5 or 6 orders of magnitude (up to 20 bits) may be required in AR applications. Multiple techniques can be used in combination to achieve particular requirements for a given display.

One technique is useful in some cases when a display can achieve more dynamic range than is required for a given application. For example, if the display is capable of 12 bits of dynamic range and the applications require 10 bits, then 2 bits would remain available for dimming. In one non-limiting example with linear encoding, the bright case would use 1024 levels (0, 4, 8, . . . 4092), and a quarter-dimmed case would use 1024 levels (0, 1, 2, . . . 1023).

FIG. 1 illustrates, generally at 100, multiple ranges of illumination information configured for dimming an emissive display having a general number of brightness levels, according to embodiments of the invention. As used in this description of embodiments, the term "illumination information" flexibly refers to information that is used to produce different brightness from a pixel. Some non-limiting examples of illumination information are, but are not limited to, a voltage or a current, an integer value in an array of values that correspond with voltage, current, etc. that is used to provide different brightness values from a pixel or a display made from an array of pixels.

With reference to FIG. 1, an array of illumination information is indicated at 102. A first range of illumination information spans a range from zero to Z as indicated at 104, Where zero represents illumination information that will produce a minimum pixel brightness and Z represents illumination information that will produce a maximum pixel brightness. A second range of illumination information spans a range from zero to X as indicated at 106. Similarly, zero represents illumination information that will produce a minimum pixel brightness and X represents illumination information that will produce a maximum pixel brightness for the range zero to X. Note that Z is greater than X, therefore the range of illumination values provided by 106 is less than the range of illumination values provided by 104. Therefore, a display operated by the range 106 will be dimmer than when the display is operated by the range 104, Conversely stated the display operated by the range 104 will appear brighter than when the display is operated with the range 106.

Figure 2:
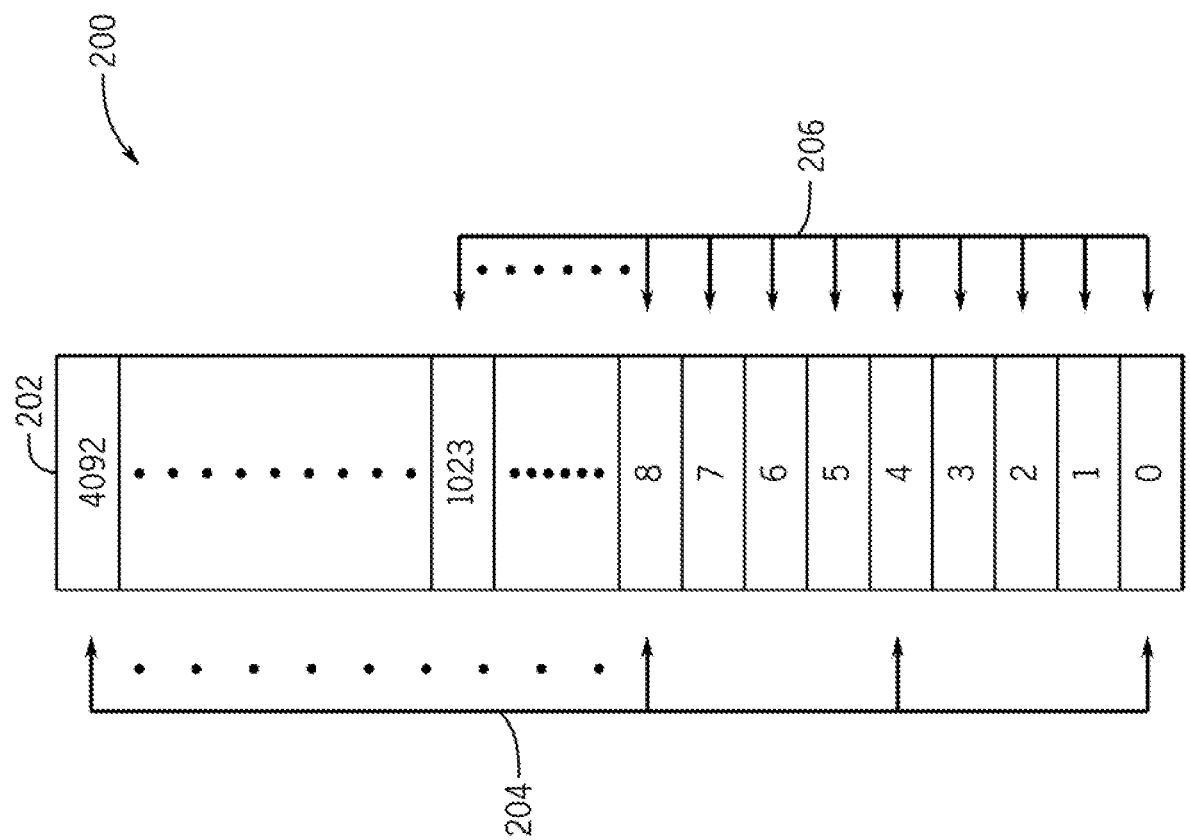
FIG. 2 illustrates multiple ranges of illumination information configured for dimming an emissive display having four states reserved for brightness levels, according to embodiments of the invention.

FIG. 2 illustrates, generally at 200, multiple ranges of illumination information configured for dimming an emissive display having four states reserved for brightness levels, according to embodiments of the invention. With reference to FIG. 2, a first range of illumination information spans a range from zero to 4092 as indicated at 204. Where zero represents illumination information that will produce a minimum pixel brightness and 4092 represents illumination information that will produce a maximum pixel brightness. A second range of illumination information spans a range from zero to 1023 as indicated at 206. Similarly, zero represents illumination information that will produce a minimum pixel brightness and 1023 represents illumination information that will produce a maximum pixel brightness for the range zero to 1023. If the illumination information follows a linear increase from values zero to 4092, then the 206 will be one quarter as bright as the 204 range. Two other ranges, the fifty percent bright case and the seventy-five percent bright case are contained within the range zero to 4092 but are not indicated to preserve clarity in the illustration.

Note that in some embodiments, other multipliers (referred to herein as non-integer multipliers) are used to provide different subranges of the full range of illumination information shown above with the non-limiting example using zero to 4092. For example, in the case illustrated in FIG. 2, a forty (40) percent case is obtained by using a non-integer multiplier of 1.6 times the 1023 making the maximum value of the 40 percent case 1637. Non-integer multipliers can introduce rounding which can lead to some differential non-linearity with respect to the illumination information represented by the resulting range. However, such differential nonlinearity can be acceptable to a user in various cases.

The examples given herein are provided merely for illustration with no limitation implied thereby. In some embodiments, 12 bits of dynamic range are provided with a resulting range of illumination values spanning zero to 4095, where $4095=2^{12}-1$. In other cases, ranges are scaled. For example, a range of illumination information based on 10 bits of dynamic range has a maximum value of 1023, where $1023=2^{10}-1$. Scaling the 10 bit range to 12 bits results in 4092 for a maximum value for the scaled range.

Figure 3:
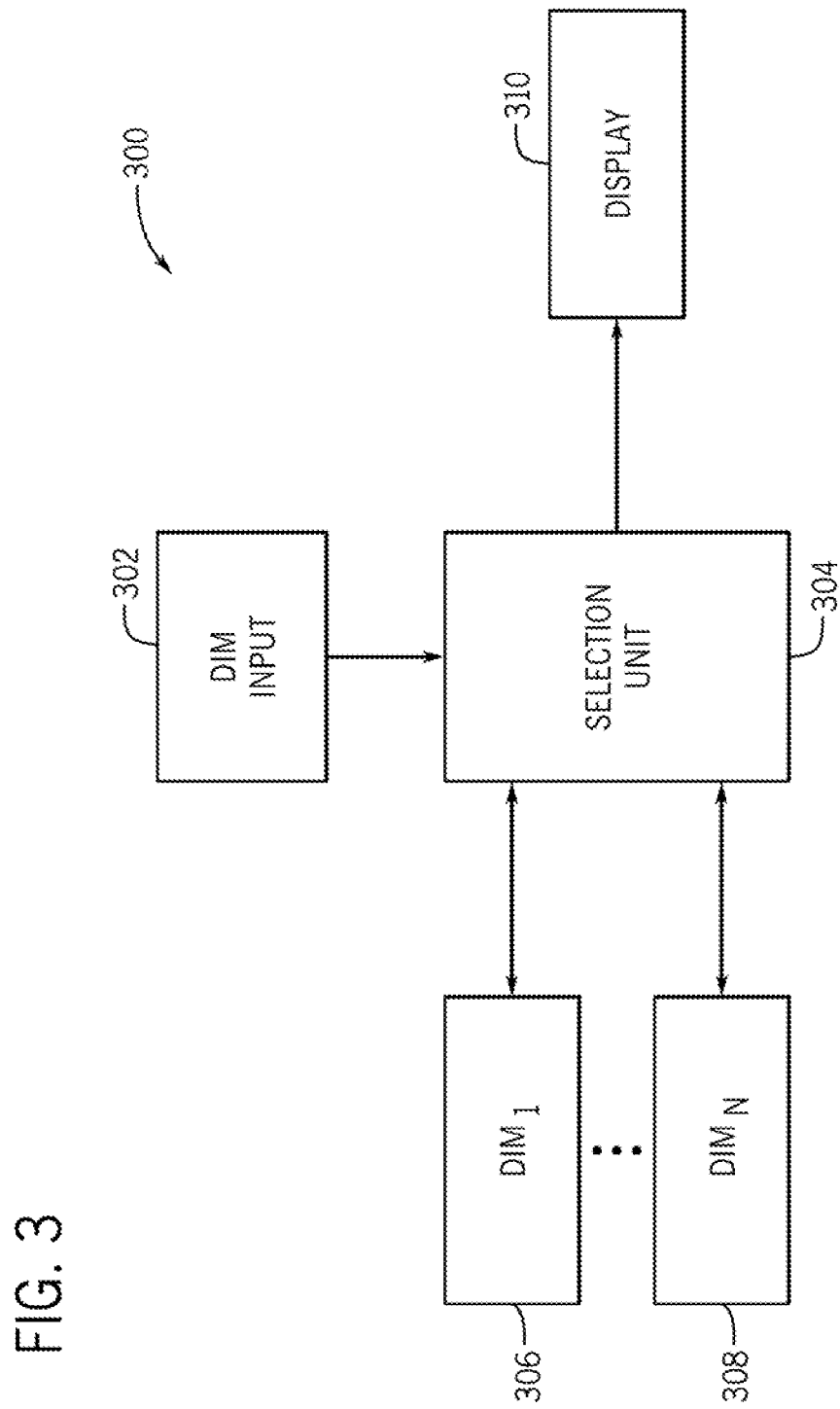
FIG. 3 illustrates a flow diagram for dimming an emissive display utilizing multiple ranges of illumination information, according to embodiments of the invention.

FIG. 3 illustrates, generally at 300, a flow diagram for dimming an emissive display utilizing multiple ranges of illumination information, according to embodiments of the invention. With reference to FIG. 3, a dimming input 302 is input into a selection unit 304. In one or more embodiments, the dimming input 302 is an output of a control that is used to adjust a brightness of a display. The selection unit 304 receives the dimming input 302 and uses the dimming input 302 to select between a first range of illumination information 306 and up to a $n_{th}$ range of illumination information indicated at 308 by $DIM_N$. The selected dimming information is used to set parameters of the display 310 such that a brightness of the display results from the selected dimming information. Thus, the dimming input 302 can cause the display 310 brightness to increase or decrease depending on values of the dimming input 302. As used herein, the variable n can be either a discrete variable, capable of representing a fixed set of values, or it can be a continuous variable that is not confined to a fixed set of discrete values.

Figure 4:
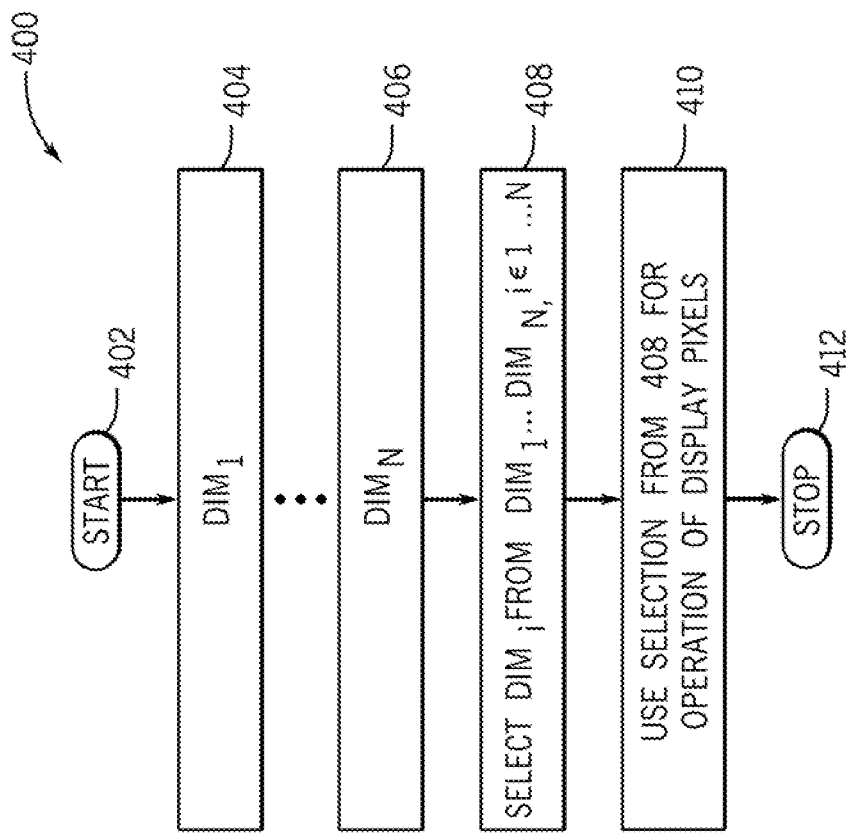
FIG. 4 illustrates a process for dimming an emissive display utilizing multiple ranges of illumination information, according to embodiments of the invention.

FIG. 4 illustrates, generally at 400, a process for dimming an emissive display utilizing various ranges of illumination information, according to embodiments of the invention. With reference to FIG. 4, a process starts at a block 402. At a block 404 a first range of illumination information is represented. The first range of illumination information corresponds to a first display brightness level when used to operate a display. Successive ranges of illumination information are represented as indicated at 406 for the $n_{th}$ range, where n is a general number and depends on how much display brightness dynamic range is available to be used for dimming. Parameter n will vary depending on a given embodiment and can be either a discrete variable representing a fixed set of values or a continuous variable that is not confined to a fixed set of values. Specific examples given herein are provided merely for illustration and no limitation is implied thereby.

At a block 408, a range of illumination information, indicated by $DIM_i$ is selected from the available ranges $DIM_1$ through $DIM_n$, where i is selected from the range 1 through n. At a block 410, the selected illumination information from the block 408 is used to operate an emissive display. In one or more embodiments, the emissive display is an OLED display. The process ends at a block 412.

Another technique for dimming an emissive display is to adjust bias voltages or currents common to the pixel array. In a voltage-drive OLED display, for example, the VCOM cathode voltage is adjusted to brighten or dim all pixels. Where VCOM is negative, a negative VCOM voltage closer to zero 0 (e.g., −2 volts) produces a dimmer pixel, while a negative voltage further away from zero (e.g., −4 volts) produces a brighter pixel. However, the OLED electrooptical response to voltage is nonlinear, and each VCOM set point must be compensated for differently.

Figure 5:
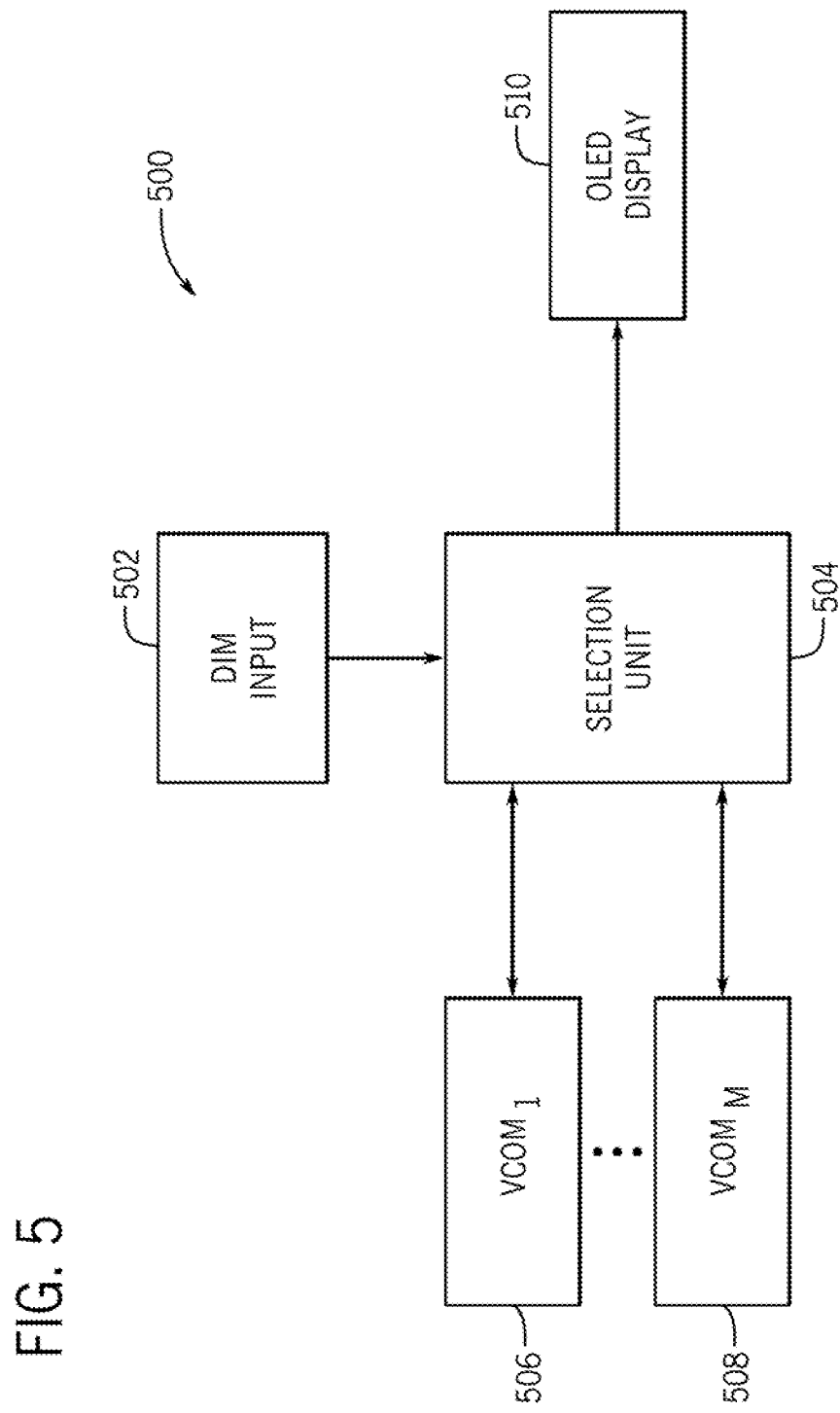
FIG. 5 illustrates a flow diagram for dimming an emissive display utilizing multiple ranges of VCOM levels, according to embodiments of the invention.

FIG. 5 illustrates, generally at 500, a flow diagram for dimming an emissive display utilizing multiple sets of VCOM levels, according to embodiments of the invention. With reference to FIG. 5, a dimming input 502 is input into a dimming selection unit 504. VCOM1 at 506 represents a VCOM setting that corresponds to a particular pixel or display brightness. Similarly, an array of VCOM values are constructed with the $M_{th}$ value represented at $VCOM_M$. The selection unit 504 selects a VCOM value from the group 506 to 508 responsive to the dimming input 502. Alternatively, the selection unit can be configured to calculate a VCOM value based on the dimming input 502. Since there is generally a non-linear relationship between VCOM and pixel brightness a mathematical relationship can be used to calculate a VCOM value responsive to the dimming input 502. The mathematical relationship is made from a calibration measurement between VCOM and a pixel brightness parameter such as illumination intensity, etc. The VCOM value selected is then used to operate the emissive display 510. In various embodiments, the emissive display 510 is an OLED display.

Figure 6:
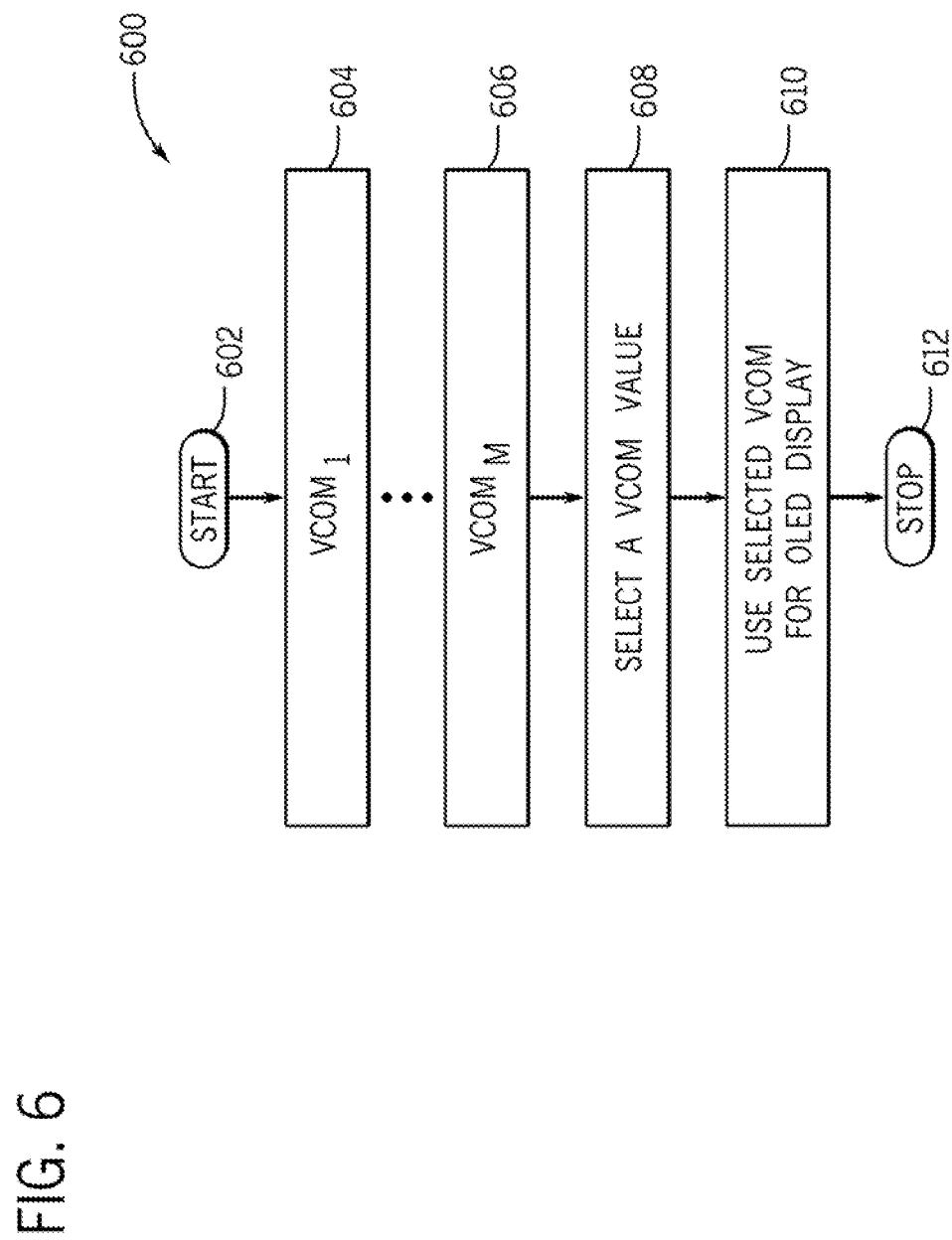
FIG. 6 illustrates a process for dimming an emissive display utilizing multiple ranges of VCOM levels, according to embodiments of the invention.

FIG. 6 illustrates, generally at 600, a process for dimming an emissive display utilizing multiple VCOM levels, according to embodiments of the invention. With reference to FIG. 6, a process starts at a block 602. At a block 604 a first VCOM value is stored, i.e., $VCOM_1$. The first VCOM level, $VCOM_1$, corresponds to a first display brightness level when $VCOM_1$ is used to operate a display. Successive VCOM values are stored as indicated at 606 for the $M_{th}$ value, where M is a general number. At a block 608 a VCOM value is selected from 604 through 606 based on a dimming input. Alternatively at the block 608, as described above in conjunction with FIG. 5, a VCOM value can be calculated based on a dimming input. Parameter M will vary depending on a given embodiment. At a block 610, the selected VCOM value from the block 608 is used to operate an emissive display. In one or more embodiments, the emissive display is an OLED display. The process ends at a block 612. Specific examples given herein are provided merely for illustration and no limitation is implied thereby.

Another technique for dimming is shuttering. Shuttering operates in the time domain and can be used for dimming control with a linear response. In various embodiments, a dimming method is provided using both rolling and global shutters.

Dimming with a Combination of Global and Rolling Shutters

Shuttering is a technique for controlling image persistence, that is, limiting the time, during which, pixels are kept in the bright state. For example, shuttering with 25% duty cycle means that pixels are black 75% of the time and bright for 25% of the time.

Figure 7:
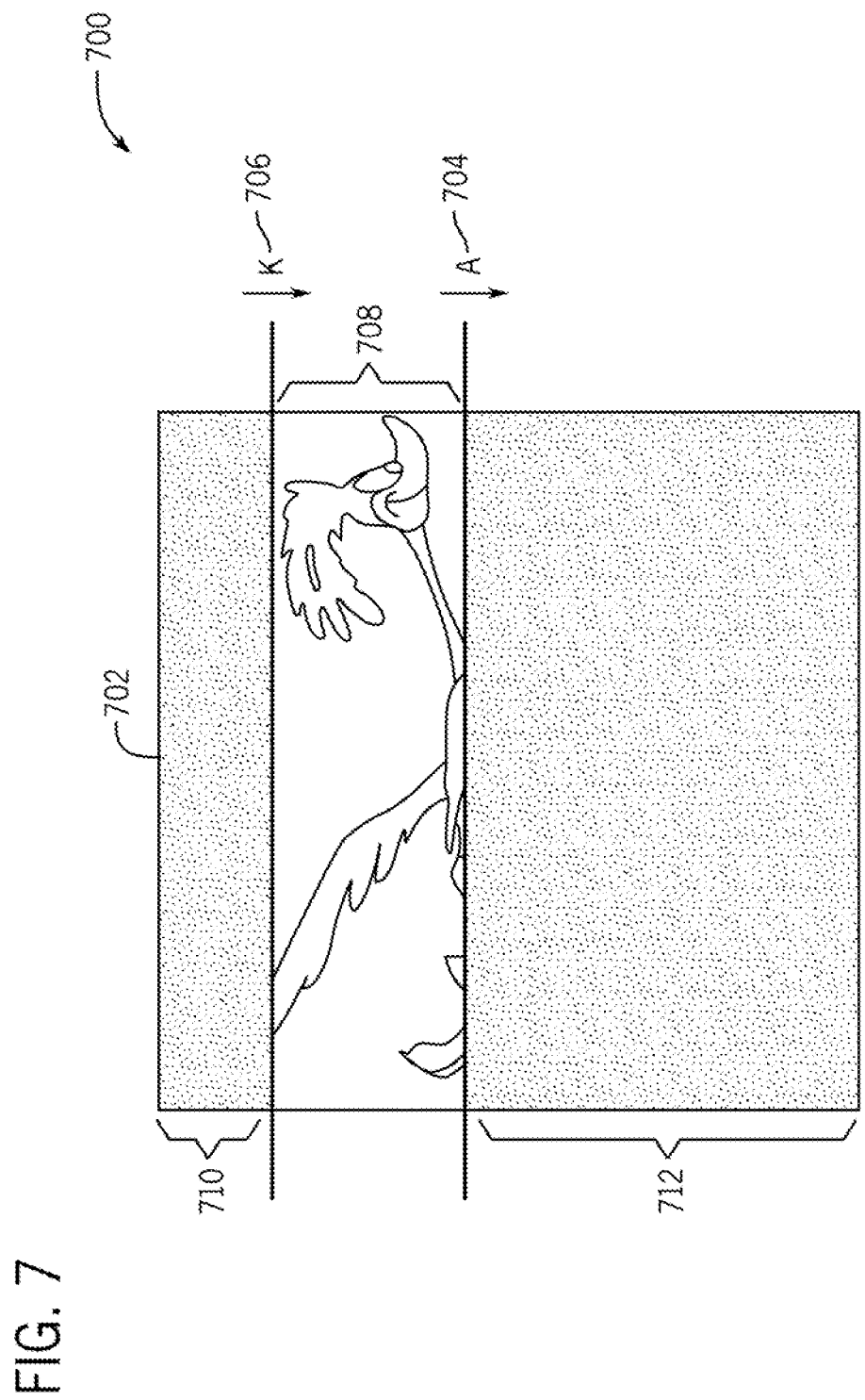
FIG. 7 illustrates rolling shutter with black line (K) trailing active line (A) according to embodiments of the invention.

FIG. 7 illustrates a rolling shutter image, generally at 700, with black line (K) 706 trailing active line (A) 704 according to embodiments of the invention. With rolling shutter, each horizontal row of a display 702 is driven to black some fixed time after it written with active video data. If the display is scanned from top to bottom, then the rolling shutter may be implemented with a black line (K) trailing 706 an active line (A) 704, as shown in FIG. 1, where a portion 708 of the display is in an ON state while portions 710 and 712 are in an OFF state. If row K 706 follows close behind row A 704, then the duty cycle will be short, but if row K 706 lags far behind the active line A 704 then the duty cycle will be long.

Figure 8:
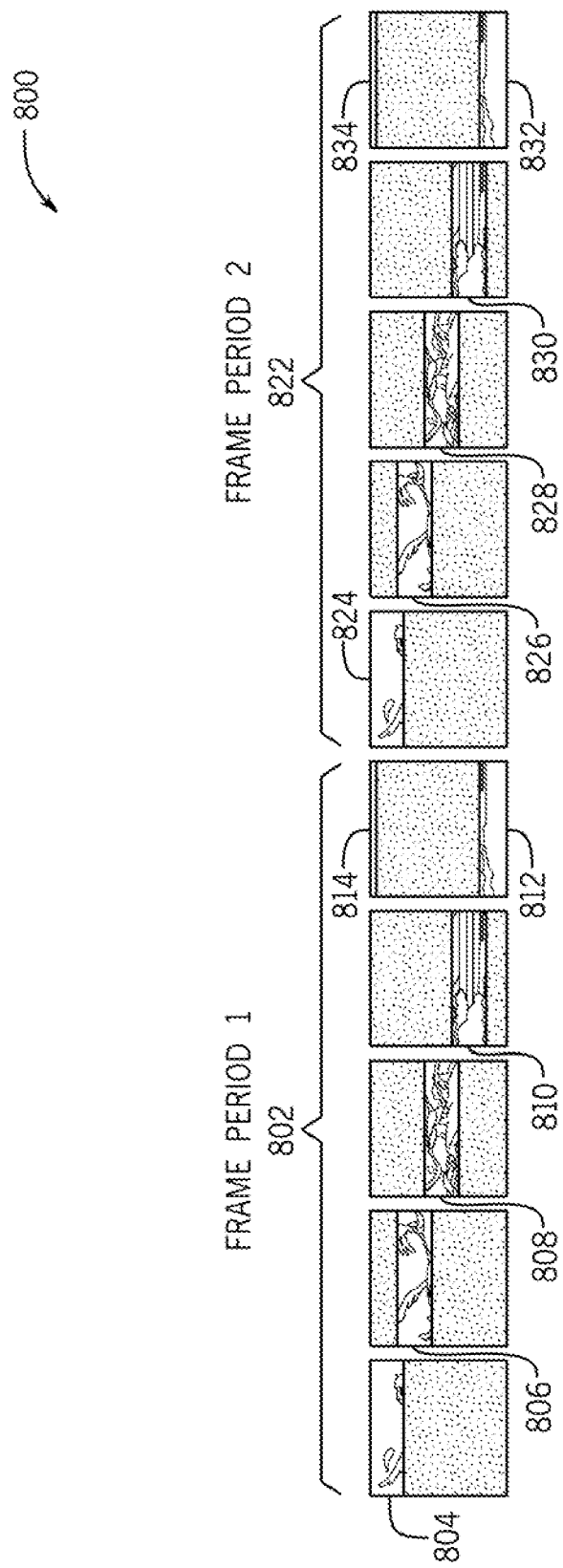
FIG. 8 illustrates rolling a shutter sequence with two frames and a 20% duty cycle, according to embodiments of the invention.

FIG. 8 illustrates a rolling shutter sequence, generally at 800, with two frames and a 20% duty cycle, according to embodiments of the invention. Each of the two frames in FIG. 8, i.e., Frame period 1 at 802 and Frame period 2 at 822 is illustrated qualitatively with five (5) views illustrating the progress of the dimming through each of the two frames shown. Views 804, 806, 808, 810, and 812 depict Frame period 1 802, Views 824, 826, 828, 830, and 832 depict Frame period 2 822. As a non-limiting example of rolling shutter implementation, rolling shutter requires the K line to follow the A line by a whole number of line intervals. The smallest interval will be a single line (A−K=1), and the next brightest will be twice as bright (A−K=2). In one non-limiting example, used only for illustration and with no limitation implied thereby, a display with S×GA format (1280×1024) can be expected to achieve 10 bits of dimming via rolling shutter. Rolling shutter allows the display to be written continuously, and therefore does not require increased data rates.

Figure 9:
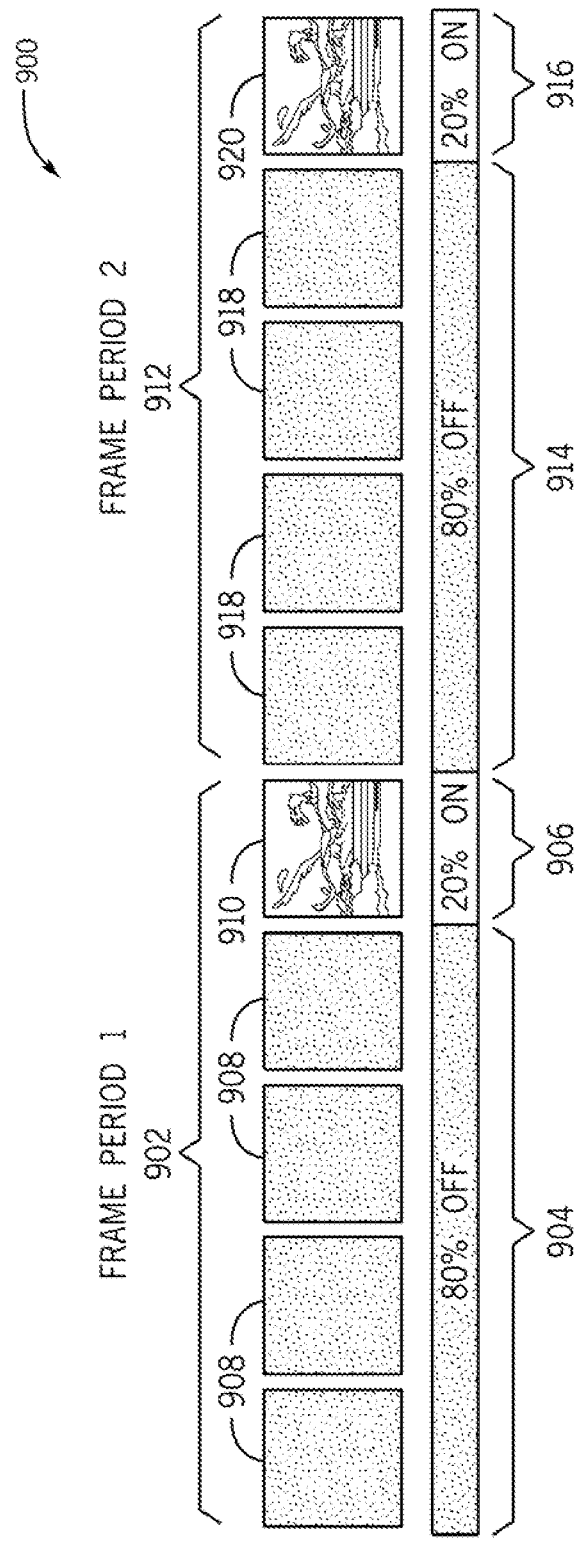
FIG. 9 illustrates a global shutter sequence with two frames and a 20% duty cycle, according to embodiments of the invention.

FIG. 9 illustrates, generally at 900, a global shutter sequence with two frames and a 20% duty cycle, according to embodiments of the invention. When global shutter is used, all or substantially all pixels are switched simultaneously ON and OFF. Global shutter requires that the entire pixel array be written before the illumination or "flash" period to turn the pixels ON. In the example illustrated in FIG. 9, given only for illustration and with no limitation implied thereby, a first frame period is indicated at 902. The first frame period 902 includes an OFF time 904, during which the display remains black as indicated at 908, lasting for eighty percent (80%) of the frame period 902 and an ON time 906, during which the display is in an ON state as indicated at 910, lasting for 20% of the frame period 902. A 20% duty cycle indicated with an ON time 906 and an OFF time 904, results in 80% of the frame period 902 available for writing image data to the display. Similarly, a second frame period 912 includes an OFF time 914, during which the display remains black, as indicated by 918, lasting for eighty percent (80%) of the frame period 912 and an ON time 916, during which time the display is in an ON state as indicated at 920, lasting for 20% of the frame period 912.

The lower the duty cycle, the smaller the ON time and the larger the duty cycle the smaller the OFF time. For a 90% duty cycle, only 10% of the frame could be used for writing during the OFF time, necessitating a 10-fold increase in peak input data rate during the OFF time.

Global shutter does not require the flash interval to be quantized in whole row intervals. In some embodiments, global shutter can require a more complex pixel design, with one or more transistors added to control the flash timing.

In various embodiments, use of global shutter or rolling shutter depends on the desired duty cycle for a display. Rolling shutter is typically used with large duty cycles, up to 100%, and global shutter is typically used for short duty cycles, typically less than the blanking time. The blanking time is the time between the end of a first frame and the beginning of the display of the second frame. Note that global shutter can be used for duty cycles that are longer than the blanking time. When this scenario is used the displayed data will include some data from a different frame. This situation may or may not be objectionable depending on the image content. For example, if a lower portion of the display contains symbology data that does not change much frame-to-frame then mixing image data from two frames might not be noticeable. However, if there is a significant change in image data frame-to-frame then mixing data from multiple frames might be noticeable and can be avoided by limiting the use of global shutter to duty cycles that are less than the blanking time.

For example, in the aforementioned SxGA format with 1024 active rows, the VESA standard specifies an additional 42 blank rows, for 1066 total rows. When the duty cycle is less than 42/1066 (approximately 3.9%), then it is advantageous to use global shutter. In the example above, it is the time needed to display 42 rows of image data. In one or more embodiments, the minimum flash interval, as constrained by internal switching delays, is less than one eighth of the line period, and the minimum global shutter duty cycle is less than ((1/8)/1066)=0.01%. Therefore, more than 13 bits of dimming may be achieved. Also, importantly, the same realization allows the global shutter duty cycle to be increased in fine increments based on the pixel clock, so that the second-dimmest setting is only slightly brighter than the minimum duty cycle setting.

In one or more embodiments, when the desired duty cycle falls between that of the maximum global shutter (42/1066 in the SxGA example) and the minimum rolling shutter (1/1066), either method can be used.

In some implementations of dimming with multiple shutters, a given dimming value might not produce exactly the same dimming for both types of shutter, hence in the transition from one shutter type to the other, an artifact such as a flicker might occur. Thus, if the same threshold (duty cycle value) is used to switch from rolling shutter to global shutter as duty cycle is decreasing as is used to switch from global shutter to rolling shutter as the duty cycle is increasing then if a dimming control was toggling right at the duty cycle value a flicker could manifest and bother the user. This problem is mitigated by using separate duty cycle values for the switching thresholds. In one or more embodiments, a hysteresis control may be used with the threshold for switching from rolling shutter to global shutter set lower than the threshold for switching from global shutter to rolling shutter.

One non-limiting example of a multiple threshold system configuration applicable to the SxGA display example above is to set the transition from rolling shutter to global shutter at a duty cycle of 2% and the transition from global shutter to rolling shutter at a duty cycle of 3%. Other values are possible and the particular values are provided merely for illustration with no limitation implied thereby.

Figure 10:
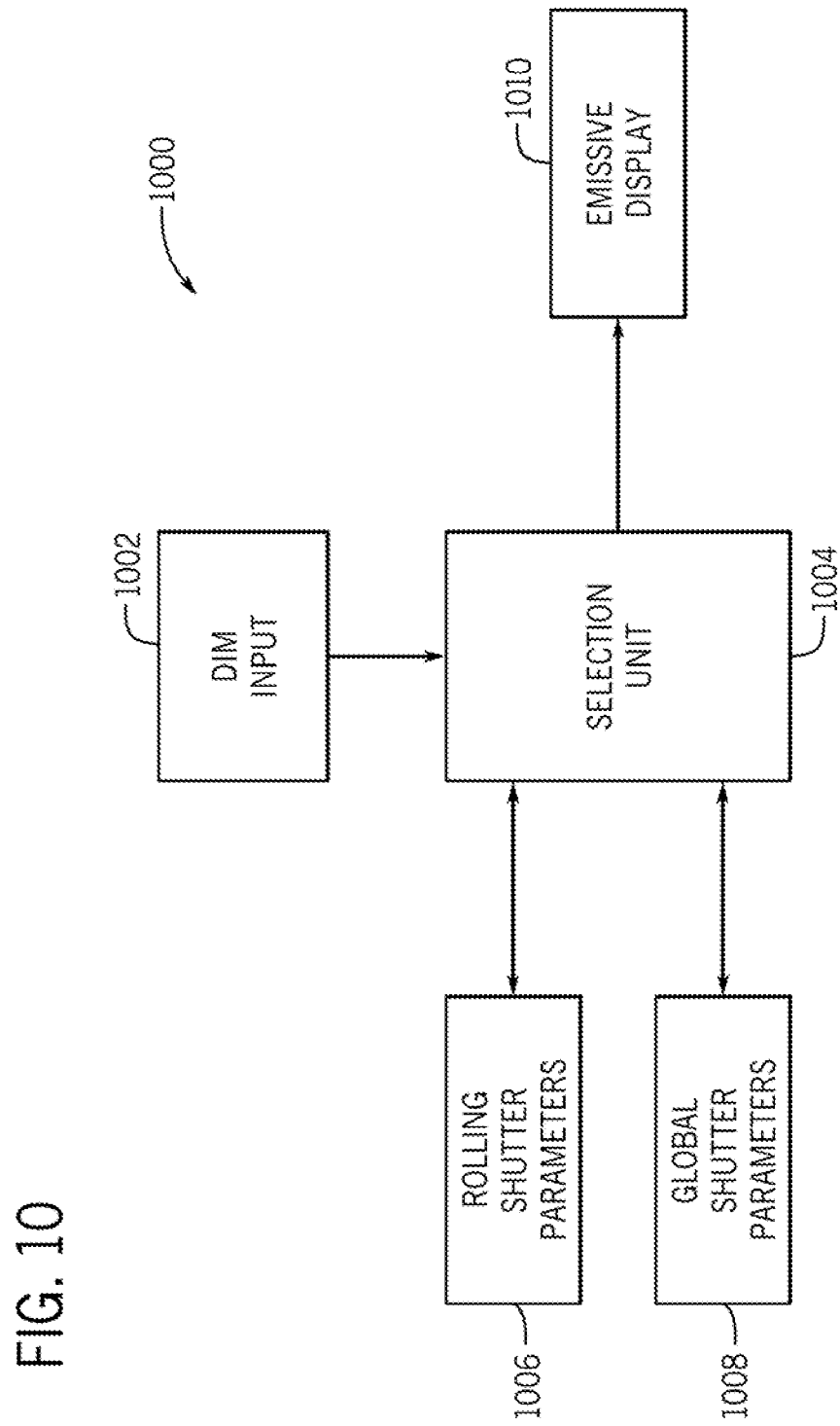
FIG. 10 illustrates a flow diagram for dimming an emissive display utilizing multiple shutters, according to embodiments of the invention.

FIG. 10 illustrates, generally at 1000, a flow diagram for dimming an emissive display utilizing multiple shutters, according to embodiments of the invention. With reference to FIG. 10, a dimming input 1002 is input into a dimming selection unit 1004. Rolling shutter parameters at 1006 are used for a range of dimming inputs 1002. Similarly, global shutter parameters at 1008 are used for a range of dimming inputs 1002. The selection unit 1004 selects shutter parameters from 1006 to 1008 responsive to the dimming input 1002. The shutter parameters selected are then used to operate the emissive display 1010. In various embodiments, the emissive display 1010 is an OLED display.

Figure 11:
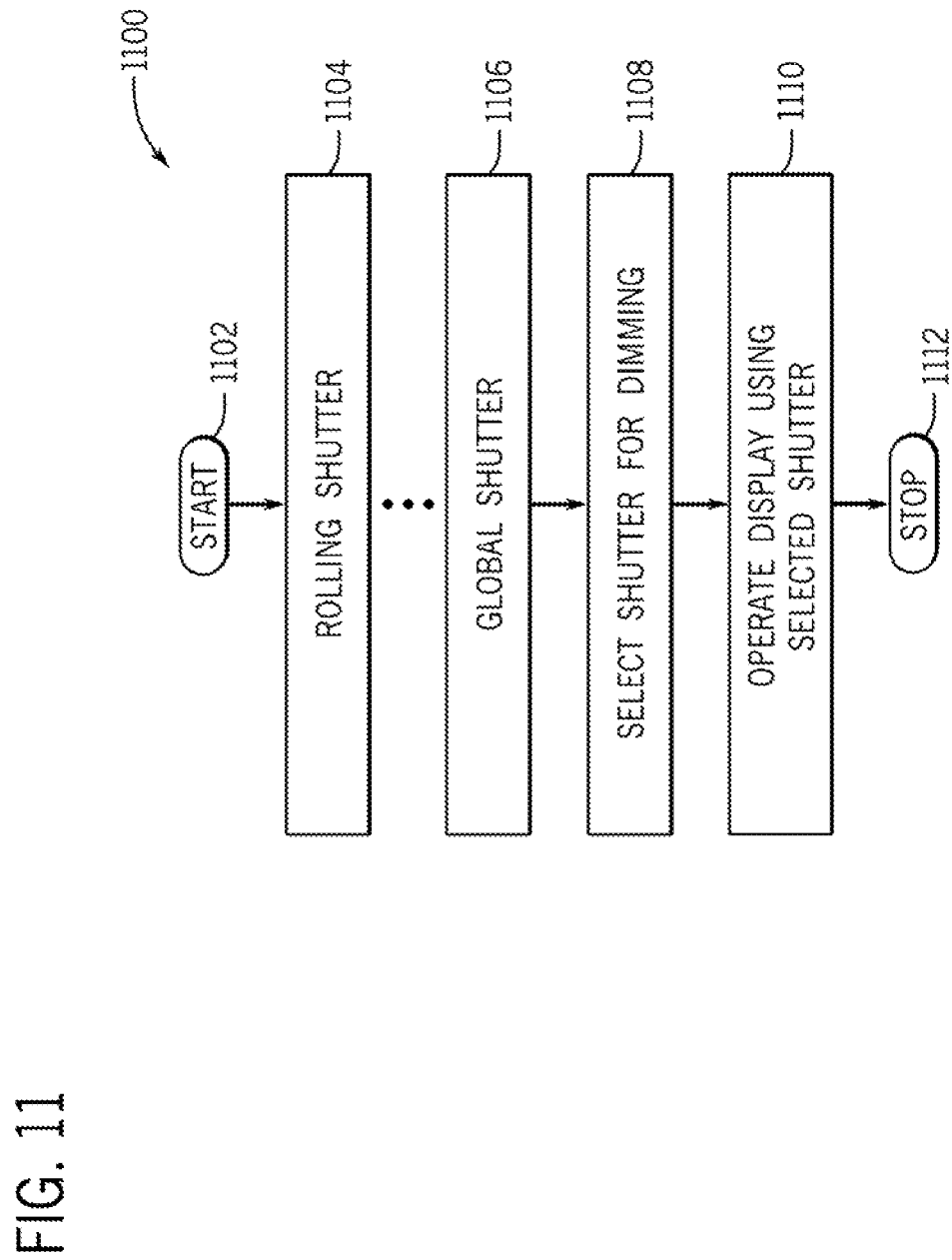
FIG. 11 illustrates a process for dimming an emissive display utilizing multiple shutters, according to embodiments of the invention.

FIG. 11 illustrates, generally at 1100, a process for dimming an emissive display utilizing multiple shutters, according to embodiments of the invention. With reference to FIG. 11, a process starts at a block 1102. At a block 1104 rolling shutter parameters are established for a given display. At a block 1106 global shutter parameters are established for the given display. At a block 1108, either rolling shutter or global shutter is selected for use in dimming the display. As described above, the type of shutter used depends on a desired dimming value and display duty cycle. At a block 1110 the display is operated at the dimming value with the selected shutter appropriate for the dimming value. The process stops at the block 1112.

Dimming with Subpixels

In various embodiments, in the spatial domain, the emissive area of each pixel can be controlled using subpixels for control of dimming, noting that each subpixel can also contain individual subpixels used for color generation. In some embodiments, color subpixels are divided into subpixels used for dimming. This division provides simplification to the circuits used to drive the subpixels, for example a common write device and a common storage device can be used across dimming subpixels within a given color subpixel. As used in this description of embodiments, the terms "segmented" and "sub" are used synonymously. For example, segmented pixel, subpixel, and segmented subpixel can refer to the same structure. Note that in some embodiments, display information is provided by using a single color referred to in the art as grayscale. Any color can be used to provide a "Grayscale" display such as but not limited to gray, green, red, blue, etc. Subpixel dimming in the spatial domain achieves linear dimming control.

Figure 12:
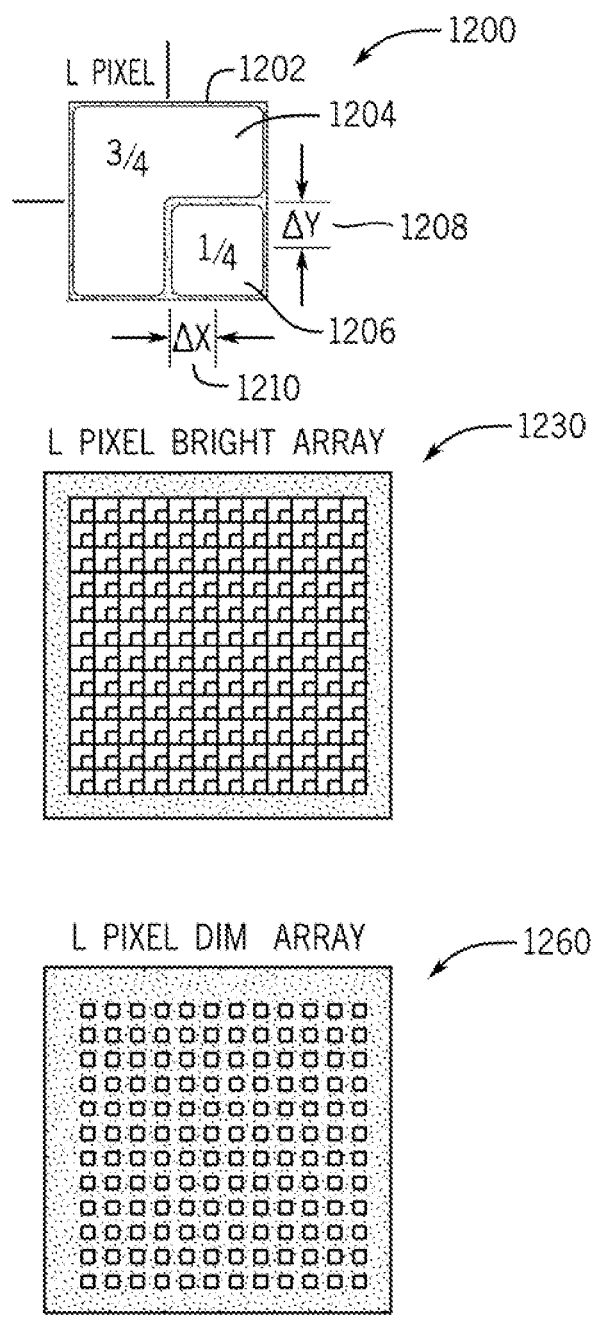
FIG. 12 illustrates, two subpixels with a 3:1 anode area ratio (L shape), according to embodiments of the invention.

In one or more embodiments, a nonlimiting example, given only as an illustration and with no limitation implied thereby utilizes two subpixels with a brightness ratio of 3:1, but it is understood that multiple subpixels and other ratios may be used. FIG. 12 illustrates, generally at 1200, two subpixels with 3:1 area ratio, according to embodiments of the invention.

In an emissive display such as an OLED display, two subpixels driven with the same voltages may be expected to have brightness proportional to their anode area. FIG. 12 shows, a pixel 1202 which has a first subpixel 1204 and a second subpixel 1206, together these two subpixels have a 3:1 anode area ratio. In this configuration, the smaller subpixel 1206 is shown as a square and the larger pixel 1204 is show with an L-shape. It is recognized that other shapes are possible and may be preferred for other applications. In various embodiments, the subpixel structure shown in FIG. 12 can be employed for a full color pixel which is made using individual subpixels for color such as red, green, and blue subpixels or it can be used to provide a grayscale display.

Note that the larger subpixel 1204 is nominally L-shaped with two long sides. Bisecting lines placed perpendicular to each of the two long sides at a midpoint of each of the two long sides will intersect at a central point. Similarly, bisecting lines placed perpendicular to two sides at a midpoint of each of two perpendicular sides of the smaller subpixel 1206 will intersect at a central point. The bisecting lines of the large subpixel 1204 are not collinear with the bisecting lines of the smaller subpixel 1206. Non-collinear bisecting lines result in the point of intersection of the bisecting lines for the larger subpixel 1204 being shifted from the point of intersection of the bisecting lines for the smaller subpixel 1206. A shift in the X direction is indicated at 1210 ($\Delta X$) and a shift in the Y direction is indicated at 1208 ($\Delta Y$). An L-shaped subpixel configuration results in a small image shift occurring in both the X and Y directions as indicated.

In operation, when both the larger subpixel 1204 and the smaller subpixel 1206 are in an ON state an array of pixels will appear as illustrated at 1230 for the L-shaped subpixel bright array. The dimmest setting for the L-shaped subpixel array is achieved by placing the larger subpixels, e.g., 1204 in the OFF state and the smaller subpixels, e.g., 1206 in the ON state as illustrated at 1260 for the L-shaped subpixel dim array. A third brightness setting (not shown) is achieved by placing the larger subpixels, e.g., 1204 in the ON state and the smaller subpixels, e.g., 1206 in the OFF state.

Figure 13:
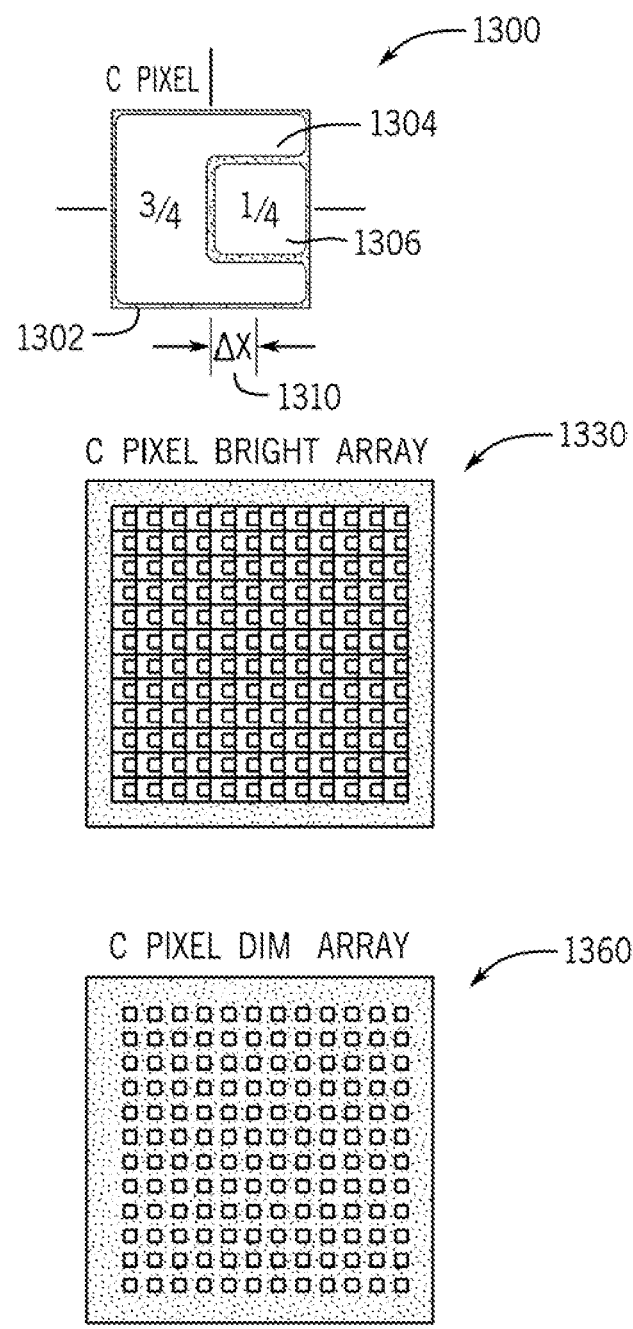
FIG. 13 illustrates, two subpixels with a 3:1 anode area ratio (C shape), according to embodiments of the invention.

FIG. 13 illustrates, two subpixels with a 3:1 anode area ratio (C shape), according to embodiments of the invention. With reference to FIG. 13, in this configuration, the smaller subpixel 1306 is shown as a square and the larger pixel 1304 is show with a C-shape. It is recognized that other shapes are possible and may be preferred for other applications. In various embodiments, the subpixel structure shown in FIG. 13 can be employed for a full color pixel which is made using individual subpixels for color such as red, green, and blue subpixels or it can be used to provide a grayscale display.

Note that the larger subpixel 1304 is nominally C-shaped with three long sides. Bisecting lines placed perpendicular to each of the two long sides, at a midpoint of each of the two long sides, will intersect at a central point. Similarly, bisecting lines placed perpendicular to two sides at a midpoint of each of two perpendicular sides of the smaller subpixel 1306 will intersect at a central point. The bisecting lines of the large subpixel 1304 are not collinear with the bisecting lines of the smaller subpixel 1306. Non-collinear bisecting lines result in the point of intersection of the bisecting lines for the larger subpixel 1304 being shifted from the point of intersection of the bisecting lines for the smaller subpixel 1306. A shift in the X direction is indicated at 1310 ($\Delta X$). A C-shaped subpixel configuration results in a small image shift occurring in only one direction, i.e, the X direction as indicated.

In operation, when both the larger subpixel 1304 and the smaller subpixel 1306 are in an ON state an array of pixels will appear as illustrated at 1330 for the C-shaped subpixel bright array. The dimmest setting for the C-shaped subpixel array is achieved by placing the larger subpixels, e.g., 1304 in the OFF state and the smaller subpixels, e.g., 1306 in the ON state as illustrated at 1360 for the C-shaped subpixel dim array. A third brightness setting (not shown) is achieved by placing the larger subpixels, e.g., 1304 in the ON state and the smaller subpixels, e.g., 1306 in the OFF state.

Figure 14:
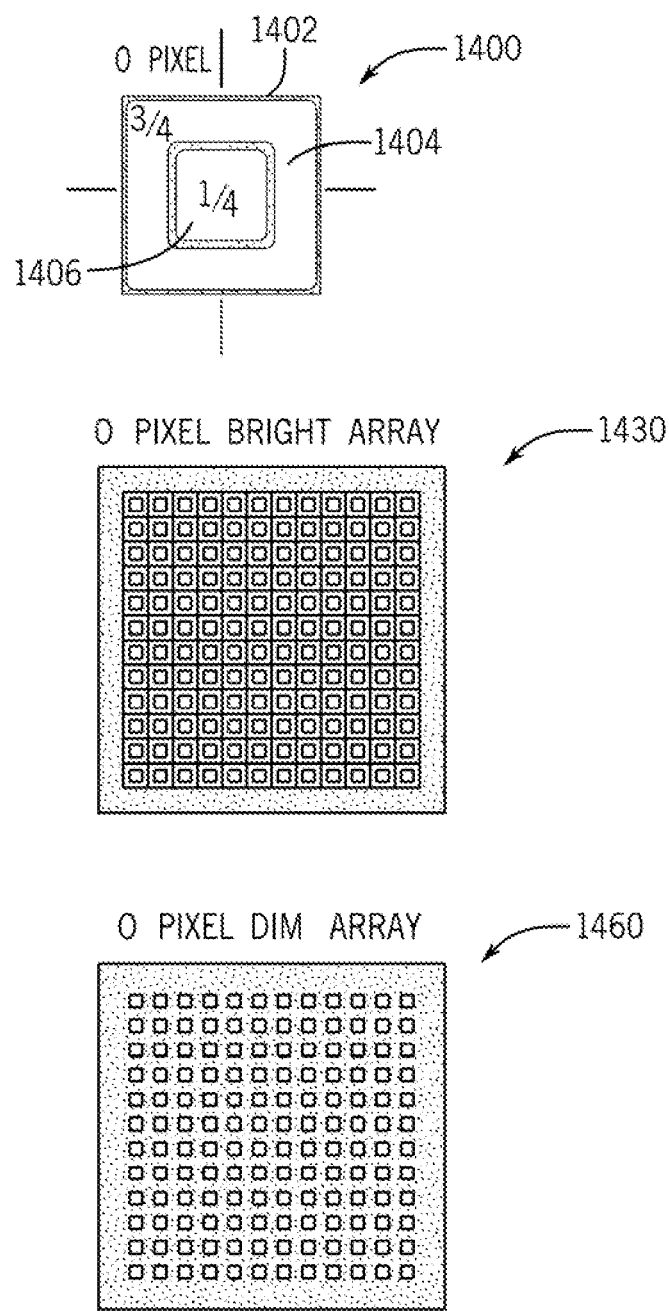
FIG. 14 illustrates, two subpixels with a 3:1 anode area ratio (O shape), according to embodiments of the invention.

FIG. 14 illustrates, two subpixels with a 3:1 anode area ratio (O shape), according to embodiments of the invention. With reference to FIG. 14, in this configuration, the smaller subpixel 1406 is shown as a square and the larger pixel 1304 is show with an O-shape. It is recognized that other shapes are possible and may be preferred for other applications. In various embodiments, the subpixel structure shown in FIG. 14 can be employed for a full color pixel which is made using individual subpixels for color such as red, green, and blue subpixels or it can be used to provide a grayscale display.

Note that the larger subpixel 1404 is nominally O-shaped with four long sides. Bisecting lines placed perpendicular to each of two long sides, at a midpoint of each of the two long sides, will intersect at a central point. Similarly, bisecting lines placed perpendicular to two sides, at a midpoint of each of two perpendicular sides, of the smaller subpixel 1406, will intersect at a central point. The bisecting lines of the large subpixel 1404 are collinear with the bisecting lines of the smaller subpixel 1406. Collinear bisecting lines result in the point of intersection of the bisecting lines for the larger subpixel 1304 and the point of intersection of the bisecting lines for the smaller subpixel 1306 being the same. Thus, there is no image shift in either the X direction or the Y direction.

In operation, when both the larger subpixel 1404 and the smaller subpixel 1406 are in an ON state an array of pixels will appear as illustrated at 1430 for the O-shaped subpixel bright array. The dimmest setting for the O-shaped subpixel array is achieved by placing the larger subpixels, e.g., 1404 in the OFF state and the smaller subpixels, e.g., 1406 in the ON state as illustrated at 1460 for the O-shaped subpixel dim array. A third brightness setting (not shown) is achieved by placing the larger subpixels, e.g., 1404 in the ON state and the smaller subpixels, e.g., 1406 in the OFF state.

Figure 15:
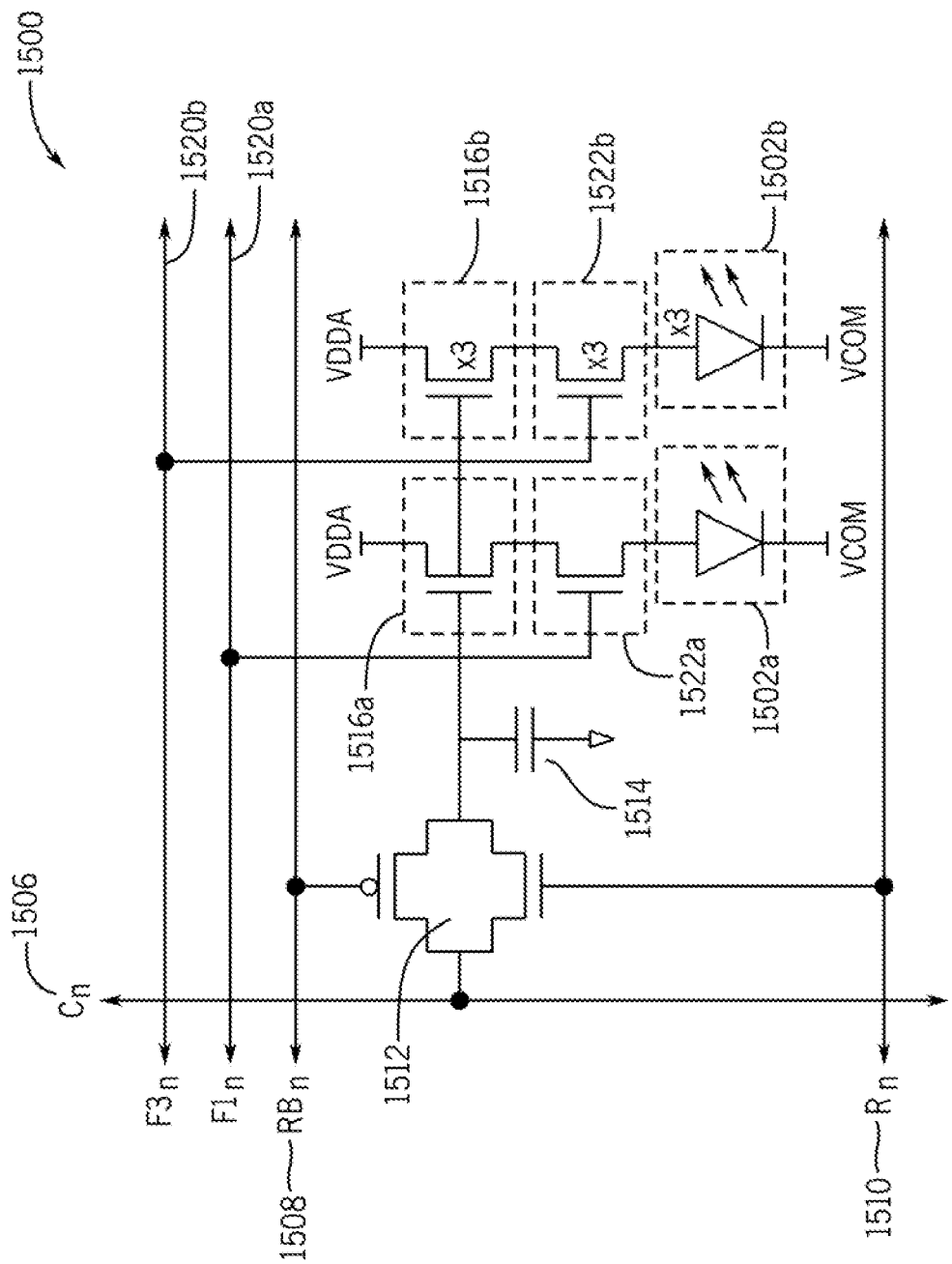
FIG. 15 illustrates, a pixel circuit diagram, according to embodiments of the invention.

FIG. 15 illustrates, a pixel circuit diagram, according to embodiments of the invention. With reference to FIG. 15, a circuit diagram representative of a pixel with two subpixels, used for dimming, such as any of the subpixels illustrated in FIG. 12, FIG. 13, or FIG. 14 is illustrated. In the discussion that follows, when reference is made to a complementary metal-oxide-semiconductor (CMOS) implementation no limitation implied thereby. In various embodiments, the back-plane circuit architecture used to drive a pixel of an emissive display utilizes a pair of write transistors (PMOS and NMOS) indicated by CMOS device 1512 to charge storage capacitor 1514 from column line 1506. In write operation, control lines 1508 and 1510 are used to charge storage capacitor 1514 to the voltage of column line 1506. Voltage on storage capacitor 1514 permits current to flow through subpixel transistors 1516*a* and 1516*b*. A first switch transistor 1522*a* is operated by a control line 1520*a*. When the switch transistor 1522*a* is switched ON, current flows through the smaller emissive subpixel and light is emitted from the emissive area 1502*a* of the smaller subpixel. The smaller subpixel can be, for example, any of the smaller subpixels, such as 1206 (FIG. 12), 1306 (FIG. 13) or 1406 (FIG. 14).

Similarly, a second switch transistor 1522*b* is operated by a second control line 1520*b*. When the second switch transistor 1522*b* is switched ON, current flows through the larger emissive subpixel and light is emitted from the emissive area 1502*b* of the larger subpixel. The larger subpixel can be, for example, any of the larger subpixels, such as 1204 (FIG. 12), 1304 (FIG. 13) or 1404 (FIG. 14).

When both switch transistors (1522*a* and 1522*b*) are in the ON state, light is emitted from both the smaller subpixel and the larger subpixel. This state is illustrated at 1230 (FIG. 12), 1330 (FIG. 13) or 1430 (FIG. 14). In various embodiments, the illumination information, described in conjunction with the figures above, is used to establish the voltages used for column line 1506.

Thus, in one or more embodiments, two subpixels share a common storage capacitor 1514, and therefore the two subpixels will be driven to the same level. Because there is only one storage node 1514 and one column line Cn 1506, the two subpixels require no more power to drive than would a single pixel of the same total area. Separate switch transistors (1522*a* and 1522*b*) are driven by signals F1*n* and F3*n*, respectively. In bright mode, both switch transistors (1522*a* and 1522*b*) will be enabled, but in dim mode the switch transistor 1522*b* for the larger subpixel will be kept off. In this way, the bright mode is 4 times brighter than the dim mode, and a 2-bit dimming ratio is achieved.

In one or more embodiments, the drive and switch transistors are scaled to match the anode area ratio, with the larger transistors drawn 3 times larger than the smaller, to provide the same current density in both subpixels. In yet other embodiments, the drive and switch transistors are drawn with similar size for the subpixels. The size of the drive and switch transistors can be adjusted as required by the constraints of a given implementation of an integrated circuit for the subpixels.

The switch signals F3*n* and F1*n* are also used in global shutter mode to enable the pixels during the flash period.

Figure 16:
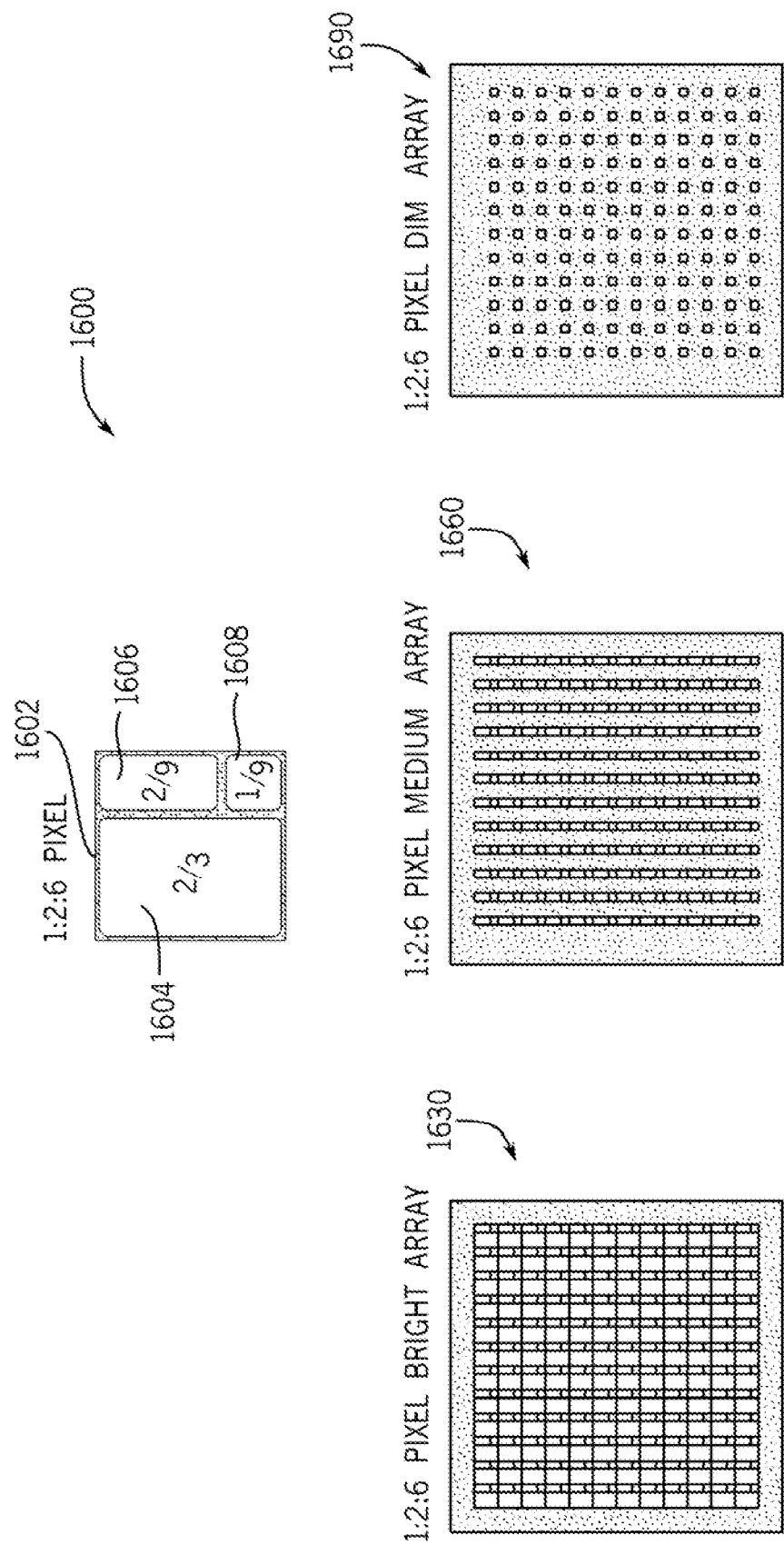
FIG. 16 illustrates, three subpixels with a 1:2:6 anode area ratio, according to embodiments of the invention.

FIG. 16 illustrates, generally at 1600, three subpixels with a 1:2:6 anode area ratio, according to embodiments of the invention. With reference to FIG. 16, in this configuration, the smaller subpixel 1608 is shown as a square, the middle sized subpixel 1606 is shown as a rectangle, and the larger subpixel 1604 is show as a rectangle. It is recognized that other shapes are possible and may be preferred for other applications. It is also recognized that more than three subpixels can be provided, as described herein. In various embodiments, the subpixel structure shown in FIG. 16 can be employed for a full color pixel which is made using individual subpixels for color such as red, green, and blue subpixels or it can be used to provide a grayscale display.

Various dimming states are possible with the three-element subpixel shown at 1600. A maximum brightness state is illustrated at 1630 where all three subpixels (1608, 1606, and 1604) are in an ON state. A dimmest state is illustrated at 1690 where only the smallest subpixels 1608 are in the ON state. One of several medium states is illustrated at 1660 where the smallest subpixels 1608 and the middle sized subpixels 1606 are in the ON state while the largest subpixels 1604 are in the OFF state.

Figure 17:
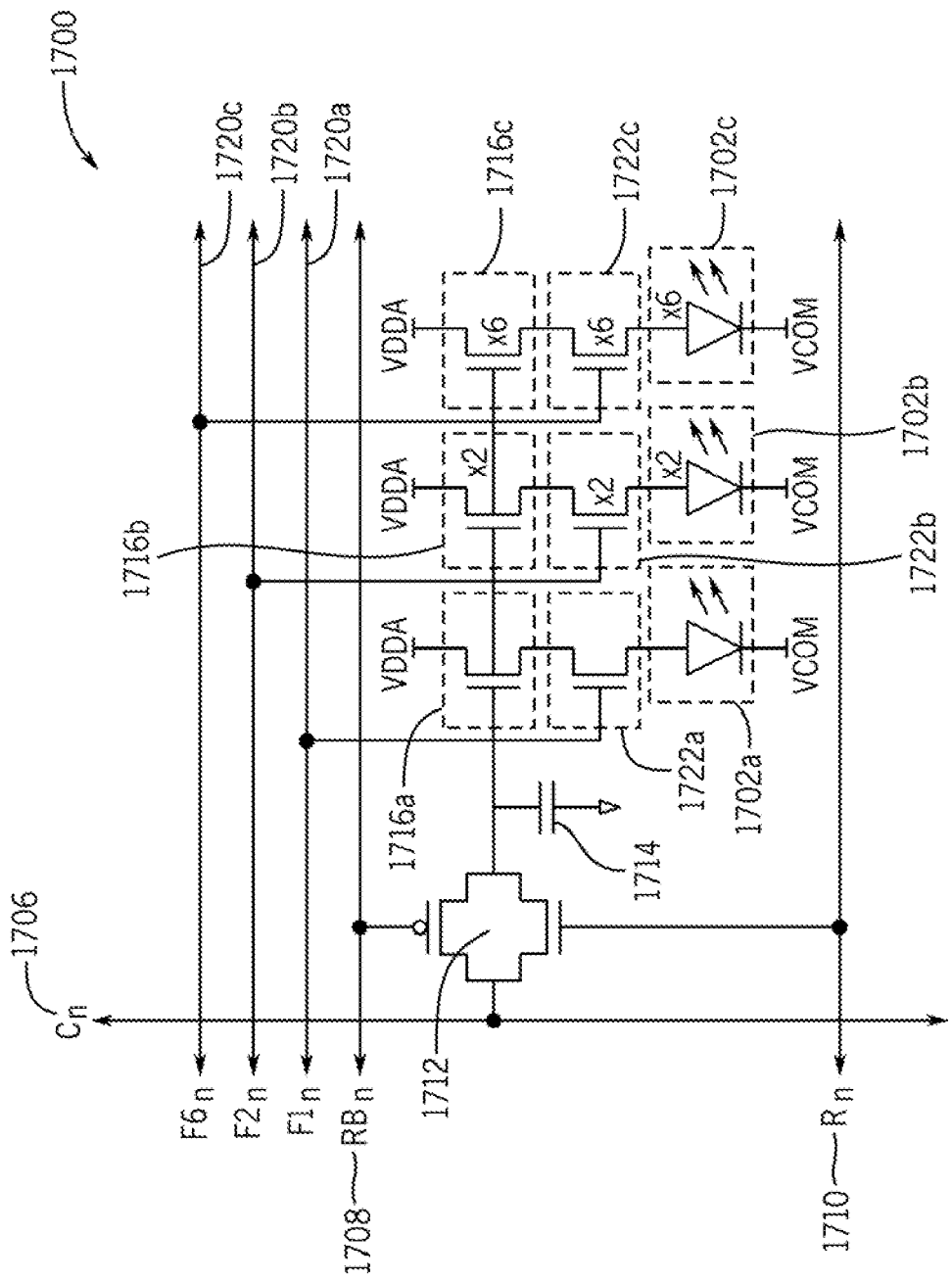
FIG. 17 illustrates, a pixel circuit diagram corresponding to FIG. 16, according to embodiments of the invention.

FIG. 17 illustrates, generally at 1700, a pixel circuit diagram corresponding to FIG. 16, according to embodiments of the invention. With reference to FIG. 17, a circuit diagram representative of a pixel with three subpixels, used for dimming, such as the subpixels of FIG. 16 is illustrated. In the discussion that follows, when reference is made to a complementary metal-oxide-semiconductor (CMOS) implementation no limitation implied thereby. In various embodiments, the back-plane circuitry architecture used to drive a pixel of an emissive display utilizes a pair of write transistors (PMOS and NMOS) indicated by CMOS device 1712 to charge storage capacitor 1714 from column line 1706. In write operation, control lines 1708 and 1710 are used to charge storage capacitor 1714 to the voltage of column line 1706. Voltage on storage capacitor 1714 permits current to flow through subpixel transistors 1716*a*, 1716*b*, and 1716*c*. A first switch transistor 1722*a* is operated by a first control line 1720*a*. When the first switch transistor 1722*a* is switched ON, current flows through the smallest emissive subpixel and light is emitted from the emissive area 1702*a* of the smallest subpixel. The smallest subpixel can be the subpixels, such as 1608 (FIG. 16).

Similarly, a second switch transistor 1722*b* is operated by a second control line 1720*b*. When the second switch transistor 1722*b* is switched ON, current flows through the middle sized emissive subpixel and light is emitted from the emissive area 1702*b* of the middle sized subpixel. The middle sized subpixel can be for example 1606 (FIG. 16).

Similarly, a third switch transistor 1722*c* is operated by a third control line 1720*c*. When the third switch transistor 1722*c* is switched ON, current flows through the largest emissive subpixel and light is emitted from the emissive area 1702*c* of the largest subpixel. The largest subpixel can be for example 1604 (FIG. 16).

In one or more embodiments, the drive and switch transistors are scaled to match the anode area ratio, with the larger transistors drawn 6 times larger than the smaller, to provide the same current density in all of the subpixels. In yet other embodiments, the drive and switch transistors are drawn with similar size for all of the subpixels. The size of the drive and switch transistors can be adjusted as required by the constraints of a given implementation of an integrated circuit for the subpixels.

The switch signals F1*n* (1720*a*), F2*n* (1720*b*), and F6*n* (1720*c*) are also used in global shutter mode to enable the subpixels during the flash period. In various embodiments, the illumination information, described in conjunction with the figures above, is used to establish the voltages used for column line 1706.

Figure 18:
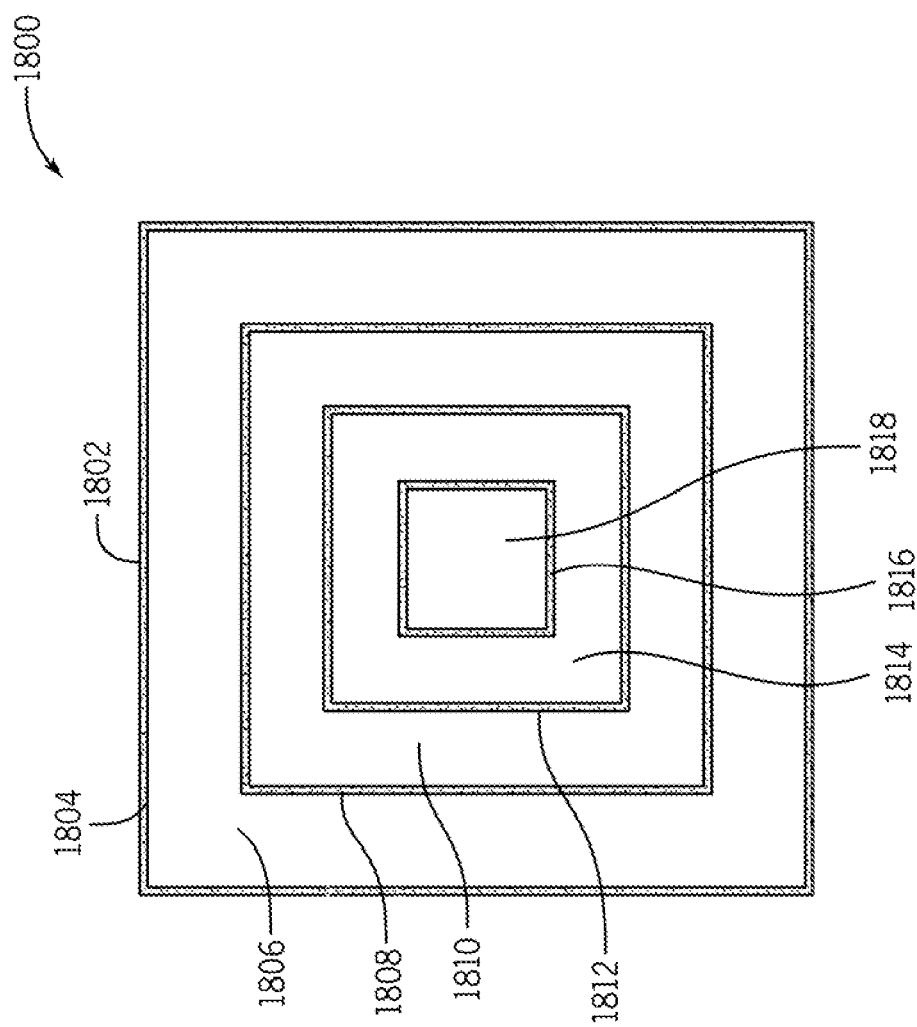
FIG. 18 illustrates, a general number of subpixels (0 shape), according to embodiments of the invention.

FIG. 18 illustrates, generally at 1800, a general number of subpixels (O-shape in this example), according to embodiments of the invention. With reference to FIG. 18, a pixel 1802 is constructed with a general number of O-shaped subpixels. A first non-emissive area 1804 defines the geometry of the pixel. A first subpixel 1806 is defined by a second non-emissive area 1808 and the first non-emissive area 1804. Similarly, a second subpixel 1810 is defined by the second non-emissive area 1808 and a third non-emissive area 1812. Finally, a general subpixel 1818 is defined by last emissive area 1816. Thus, a general number of subpixels are created for a given pixel. Note that subpixel shapes other than the O-shape shown in FIG. 18 are used in other embodiments.

Figure 19:
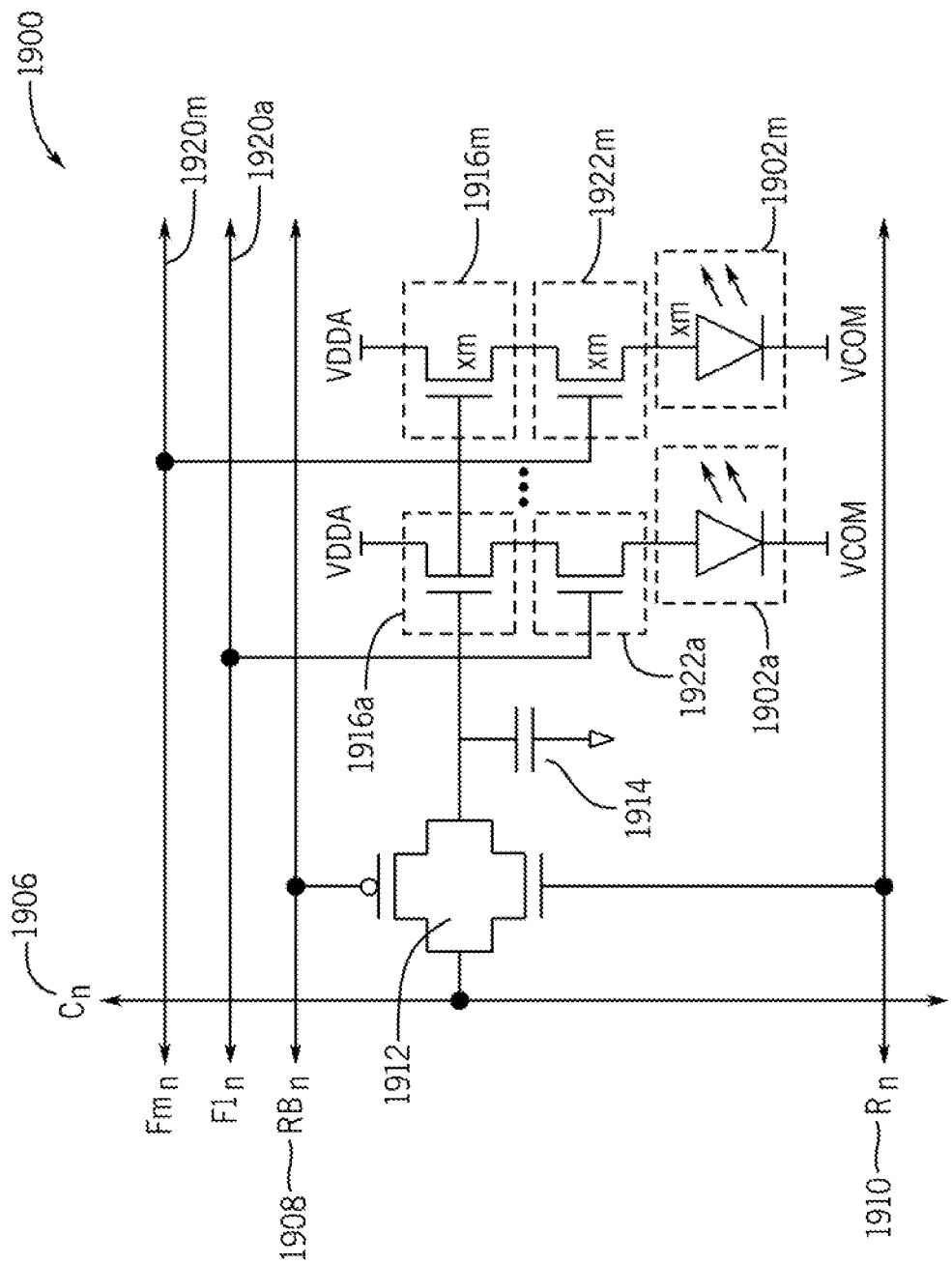
FIG. 19 illustrates, a pixel circuit diagram corresponding to FIG. 18, according to embodiments of the invention.

FIG. 19 illustrates, generally at 1900, a pixel circuit diagram corresponding to FIG. 18, according to embodiments of the invention. With reference to FIG. 19, a circuit diagram representative of a pixel with a general number m of subpixels, used for dimming, such as the subpixels of FIG. 18 is illustrated. In the discussion that follows, when reference is made to a complementary metal-oxide-semiconductor (CMOS) implementation no limitation implied thereby. In various embodiments, the back-plane circuit architecture used to drive a pixel of an emissive display utilizes a pair of write transistors (PMOS and NMOS) indicated by CMOS device 1912 to charge storage capacitor 1914 from column line 1906. In write operation, control lines 1908 and 1910 are used to operate CMOS device 1912 to charge storage capacitor 1914 to the voltage of column line 1906. Voltage on the storage capacitor 1914 permits current to flow through subpixel transistors 1916a through 1916m. A first switch transistor 1922a is operated by a first control line 1920a. When the first switch transistor 1922a is switched ON, current flows through the smallest emissive subpixel and light is emitted from the emissive area 1902a of the smallest subpixel. The smallest subpixel can be a subpixel, such as, 1818 (FIG. 18).

Similarly, an $m_{th}$ switch transistor 1922m is operated by an $m_{th}$ control line 1920m. When the $m_{th}$ switch transistor 1922m is switched ON, current flows through the $m_{th}$ emissive subpixel and light is emitted from the emissive area 1902m of the $m_{th}$ subpixel. The $m_{th}$ subpixel can be for example 1806 (FIG. 18).

In one or more embodiments, the drive and switch transistors are scaled to match the anode area ratio, with the larger transistors drawn m times larger than the smallest, to provide the same current density in all of the subpixels. In yet other embodiments, the drive and switch transistors are drawn with similar size for all subpixels. The size of the drive and switch transistors can be adjusted as required by the constraints of a given implementation of an integrated circuit for the subpixels.

The switch signals F1n (1920a) through F1mn (1920m) are also used in global shutter mode to enable the pixels during the flash period. In various embodiments, the illumination information, described in conjunction with the figures above, is used to establish the voltages used for column line 1906.

In various embodiments, multiple dimming techniques are applied to an emissive display such as an OLED display, depending on a desired amount of dimming that is desired for the given display and application.

FIG. 20 illustrates, generally at 2000, a flow diagram for dimming an emissive display utilizing multiple processes, according to embodiments of the invention. With reference to FIG. 20, a dimming input 2002 is input into a dimming logic/control unit 2004. One or more of the four dimming techniques described above are selected by the dimming logic/control unit 2004 and are used to dim an emissive display 2014. A first dimming technique 2006 utilizes a portion of the dynamic range of the pixel brightness for dimming. A second dimming technique 2008 adjusts VCOM across all pixels for dimming. A third dimming technique 2010 selects a shutter method, ie., rolling shutter or global shutter. A fourth dimming technique 2012 adjusts an emissive area of the display pixels by turning ON or OFF subpixels.

The four dimming techniques 2006, 2008, 2010, and 2012 can be used individually or in any combination to dim pixels of an emissive display such as an OLED display. In some use cases, a display is used in very low back light environments, such as those that exist during nighttime or in a room with poor light or no light. In such low ambient light environments, a display can be used to provide image information from a night vision camera, for example, that a user cannot see with the naked eye. In this environment, it is desirable to maximize the dynamic range of the display while taking care not to blind the user with display brightness that is set too high. Thus, in some embodiments, the process 2006 would not be used in order to maximize dynamic range in order to render the image information. The process 2008 would use a less negative VCOM voltage perhaps −1.5 volts to −2 volts to dim the pixels. Process 2010 would be set to global shutter with a short duty cycle to dim the pixels. The process 2012 would be set to the minimum subpixel area or a subpixel area at the low end. Configured as such, the display could be used for night vision to provide high dynamic range images while not blinding the user with a display that is too bright.

At the other end of the spectrum is the use case of full sunlight, where the display is used in broad daylight. Thus, in some embodiments, in this use case, the display might be used to display symbology information to a user, such as alpha numeric characters instead of image information (e.g., land topography). Dynamic range can be sacrificed, only the high end or equivalently stated, the bright end of the dynamic range is needed to display alpha numeric symbology characters. Thus, the process 2006 is used to give up some dynamic range in order to increase display brightness. Only a few bits of dynamic range are needed. The process 2008 is used to increase the brightness of the display pixels by making VCOM more negative. In some embodiments, this means making VCOM approximately equal to, for example, −4 volts. The process 2010 operates the display at a high duty cycle, using for example rolling shutter to contribute to display brightness. The process 2012 is set to enable full pixel area to contribute to display brightness.

Thus, in various configurations techniques for dimming are combined to provide very large ranges of dimming for emissive displays such as OLED displays. Note that other combination of dimming techniques listed above can be combined in various embodiments of the invention. Two use cases were described, one for night mode and the other for day mode, however as the ambient light level changes, the four dimming processes 2006, 2008, 2010, and 2012 are used in various combinations and configurations to provide a display that communicates information to a user without blinding the user or rendering the information unintelligible.

In various embodiments, the components of the OLED systems as well as the OLED systems described in the previous figures are implemented in an integrated circuit device, which may include an integrated circuit package containing the integrated circuit. In some embodiments, the components of systems as well as the systems are implemented in a single integrated circuit die. In other embodiments, the components of systems as well as the systems are implemented in more than one integrated circuit die of an integrated circuit device which may include a multi-chip package containing the integrated circuit. In some embodiments, an OLED display and the OLED display backplane circuitry are implemented on the same integrated circuit chip.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the embodiments of the present invention. It will be evident, however, to one of ordinary skill in the art that embodiments of the present invention may be practiced without these specific details. In some instances, well-known structures and devices are shown in block diagram form, rather than in detail, in order to avoid obscuring embodiments of the present invention. These embodiments are described in sufficient detail to enable those of ordinary skill in the art to practice the invention, and it is to be understood that other embodiments may be utilized and that logical, mechanical, electrical, and other changes may be made without departing from the scope of embodiments of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, waveforms, data, time series or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, mathematical expression, flow diagram or flow chart. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

Thus, embodiments of the invention can be used to provide a dimmable high brightness OLED display. Some non-limiting examples of OLED systems where embodiments of the invention are used are, but are not limited to; mobile phone, large screen displays, use in a near-to-eye (NTE) display or a headset computing device. Other embodiments of the invention are readily implemented in a wearable or a head wearable device of general configuration, such as but not limited to; wearable products such as virtual reality (VR), augmented reality (AR), mixed reality (MR); wristband, watch, glasses, goggles, a visor, a head band, a helmet, etc. or the like. As used in this description of embodiments, wearable encompasses, head wearable, wrist wearable, neck wearable, thus any form of wearable that can be applied to a user.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. A method for dimming an organic light emitting diode (OLED) display comprising:
receiving as an input a dimming level setpoint signal;
establishing a selected duty cycle based on the dimming level setpoint signal;
utilizing rolling shutter to dim the OLED display when the selected duty cycle is in a range from a first low limit to a duty cycle of 100 percent; and
utilizing global shutter to dim the OLED display when the selected duty cycle is in a range from a second low limit to a minimum duty cycle for the OLED display, wherein the first low limit is used to switch from rolling shutter to global shutter when the selected duty cycle is decreasing, the second low limit is used to switch from global shutter to rolling shutter when the selected duty cycle is increasing, the first low limit is less than the second low limit and both the first low limit and the second low limit are less than a blanking time for the OLED display.

2. The method of claim 1, further comprising:
selecting a subrange of pixel illumination information from a range of pixel illumination information, wherein the range spans a greater range of brightness levels than the subrange spans, the selecting is based on a magnitude of the dimming level setpoint signal; and
driving the OLED display pixels using the subrange.

3. The method of claim 1, further comprising:
adjusting a VCOM voltage for the OLED display pixels based on the dimming level setpoint signal.

4. The method of claim 1, wherein the first low limit is equal to the second low limit and the first low limit is equal to a blanking time for the OLED display.

5. The method of claim 1, wherein an increment on the global shutter is established by a pixel clock period.

6. A non-transitory computer-readable storage medium storing program code for causing a data processing system to perform the steps comprising:
receiving as an input a dimming level setpoint signal;
establishing a selected duty cycle based on the dimming level setpoint signal;
utilizing rolling shutter to dingy the OLED display when the selected duty cycle is in a range from a first low limit to a duty cycle of 100 percent; and
utilizing global shutter to dim the OLED display when the selected duty cycle is in a range from a second low limit to a minimum duty cycle for the OLED display, wherein the first low limit is used to switch from rolling shutter to global shutter when the selected duty cycle is decreasing, the second low limit is used to switch from global shutter to rolling shutter when the selected duty cycle is increasing, the first w limit is less than the second low limit and both the first low limit and the second low limit are less than a blanking time for the OLED display.

7. The non-transitory computer-readable storage medium of claim 6, wherein an increment on the global shutter s established by a pixel clock period.

8. The non-transitory computer-readable storage medium of claim 6, wherein the first low limit is equal to the second low limit and the first low limit is equal to a blanking time for the OLED display.

9. The non-transitory computer-readable storage medium of claim 6, further comprising:
selecting a subrange of pixel illumination information from a range of pixel illumination information, wherein the range spans a greater range of brightness levels than the subrange spans, the selecting is based on a magnitude of the dimming level setpoint signal; and
driving the OLED display pixels using the subrange.

10. The non transitory computer-readable storage medium of claim 6, further comprising:
adjusting a VCOM voltage for the OLED display pixels based on the dimming level setpoint signal.

11. A method for dimming an organic light emitting diode (OLED) display comprising:
receiving a dimming level setpoint;
selecting a subrange of pixel illumination levels from a range of pixel illumination levels based on the dimming level setpoint;
adjusting a VCOM voltage for the OLED display based on the dimming level setpoint;
establishing a selected duty cycle based on the dimming level setpoint signal;
utilizing rolling shutter to dim the OLED display when the selected duty cycle is in a range from a first low limit to a duty cycle of 100 percent; and
utilizing global shutter to dim the OLED display when the selected duty cycle is in a range from a second low limit to a minimum duty cycle for the OLED display, wherein the first low limit is used to switch from rolling shutter to global shutter when the selected duty cycle is decreasing, the second low limit is used to switch from global shutter to rolling shutter when the selected duty cycle is increasing, the first low limit is less than the second low limit and both the first low limit and the second low limit are less than a blanking time for the OLED display; and
illuminating one or more segments from each segmented pixel of the OLED display, each segmented pixel comprising:
at least a first emissive area;
at least a second emissive area; and
a non-emissive area, the non-emissive area is disposed between the at least the first emissive area and the at least the second emissive area, in operation the OLED display is dimmed based on the dimming level setpoint.

12. A non-transitory computer-readable storage medium storing program code for causing a data processing system to perform the steps comprising:
receiving a dimming level setpoint;
selecting a subrange of pixel illumination levels from a range of pixel illumination levels based on the dimming level setpoint;
adjusting a VCOM voltage for the OLED display based on the dimming level setpoint;
establishing a selected duty cycle used on the dimming level setpoint signal;
utilizing rolling shutter to dim the OLED display when the selected duty cycle is in a range from a first low limit to a duty cycle of 100 percent; and
utilizing global shutter to dim the OLED display when the selected duty cycle is in a range from a second low limit to a minimum duty cycle for the OLED display, wherein the first low limit is used to switch from rolling shutter to global shutter when the selected duty cycle is decreasing, the second low limit is used to switch from global shutter to rolling shutter when the selected duty cycle is increasing, the first low limit is less than the second low limit and both the first low limit and the second low limit are less than a blanking time for the OLED display; and
illuminating one or more segments from each segmented pixel of the OLED display, each segmented pixel comprising:
at least a first emissive area;
at least a second emissive area; and
a non-emissive area, the non-emissive area is disposed between the at least the first emissive area and the at least the second emissive area, in operation the OLED display is dimmed based on the dimming level setpoints.

* * * * *